United States Patent
Hsieh et al.

(10) Patent No.: US 12,396,285 B2
(45) Date of Patent: Aug. 19, 2025

(54) INTEGRATION OF SOLAR CELL AND IMAGE SENSOR

(71) Applicant: Taiwan Semiconductor Manufacturing Company, Ltd., Hsinchu (TW)

(72) Inventors: Feng-Chien Hsieh, Pingtung County (TW); Yun-Wei Cheng, Taipei (TW); Ping Kuan Chang, Hsinchu (TW); Kuo-Cheng Lee, Tainan (TW); Cheng-Ming Wu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 506 days.

(21) Appl. No.: 17/892,846

(22) Filed: Aug. 22, 2022

(65) Prior Publication Data

US 2023/0402482 A1    Dec. 14, 2023

Related U.S. Application Data

(60) Provisional application No. 63/343,442, filed on May 18, 2022.

(51) Int. Cl.
*H10F 39/00* (2025.01)
*H01L 25/04* (2023.01)
(Continued)

(52) U.S. Cl.
CPC .......... *H10F 39/811* (2025.01); *H01L 25/043* (2013.01); *H10F 39/018* (2025.01); *H10F 39/024* (2025.01); *H10F 39/809* (2025.01); *H10F 77/315* (2025.01); *H10F 77/42* (2025.01); *H10F 77/935* (2025.01);
(Continued)

(58) Field of Classification Search
CPC .... H10F 39/811; H10F 39/018; H10F 39/024; H10F 39/809; H10F 77/315; H10F 77/42; H10F 77/935; H10F 39/182; H10F 39/8053; H10F 39/8063; H10F 39/8067; H10F 71/00; H10F 77/90; H10F 10/00;
(Continued)

(56) References Cited

U.S. PATENT DOCUMENTS 8,987,751 B2    3/2015    Ihara
10,475,847 B2   11/2019   Lu et al.
(Continued)

FOREIGN PATENT DOCUMENTS

JP    200866402 A    3/2008
TW    201827652 A    8/2018
(Continued)

*Primary Examiner* — Jonathan Han
(74) *Attorney, Agent, or Firm* — HAYNES AND BOONE, LLP

(57) ABSTRACT

The present disclosure provides an integrated circuit (IC) structure with a solar cell and an image sensor array. An integrated structure according to the present disclosure includes a first substrate including a plurality of photodiodes, an interconnect structure disposed on the first substrate, a first bonding layer disposed on the interconnect structure, a second bonding layer disposed on the first bonding layer, a second substrate disposed on the second bonding layer, and a transparent conductive oxide layer disposed on the second substrate.

20 Claims, 32 Drawing Sheets

(51) Int. Cl.
    *H10F 39/18*     (2025.01)
    *H10F 71/00*     (2025.01)
    *H10F 77/00*     (2025.01)
    *H10F 77/30*     (2025.01)
    *H10F 77/42*     (2025.01)
    *H10F 77/90*     (2025.01)

(52) U.S. Cl.
    CPC ........ *H10F 39/182* (2025.01); *H10F 39/8053* (2025.01); *H10F 39/8063* (2025.01); *H10F 39/8067* (2025.01); *H10F 71/00* (2025.01); *H10F 77/90* (2025.01)

(58) Field of Classification Search
    CPC ...... H10F 30/22; H10F 39/199; H10F 39/807; H10F 77/413; H10F 77/48; H01L 25/043
    See application file for complete search history.

(56) References Cited

U.S. PATENT DOCUMENTS

| | | | |
|---|---|---|---|
| 10,770,502 | B2 | 9/2020 | Chen et al. |
| 11,172,142 | B2 | 11/2021 | Cheng et al. |
| 11,658,194 | B2 * | 5/2023 | Lee .............. H10F 39/8057 257/292 |
| 2016/0211285 | A1 * | 7/2016 | Kim .............. H10F 39/8033 |
| 2019/0131336 | A1 * | 5/2019 | Yoon .............. H10F 39/191 |
| 2022/0216257 | A1 * | 7/2022 | Lee .............. H10F 39/8037 |

FOREIGN PATENT DOCUMENTS

| | | |
|---|---|---|
| TW | I749927 B | 12/2021 |
| TW | 202213754 A | 4/2022 |

\* cited by examiner

INTEGRATION OF SOLAR CELL AND IMAGE SENSOR

PRIORITY DATA

This application is a non-provisional application of U.S. Provisional Patent Application Ser. No. 63/343,442, filed May 18, 2022, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Image sensors, such as complementary metal-oxide-semiconductor (CMOS) image sensors (CIS), are frequently found in modern-day consumer electronics. A CIS array may be bonded to a support carrier to undergo fabrication processes. To allow light transmission, the support carrier is ground and polished to a desired thickness. The support carrier only serves as a carrier and additional steps are required to reduce its presence. Therefore, while existing image sensor structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
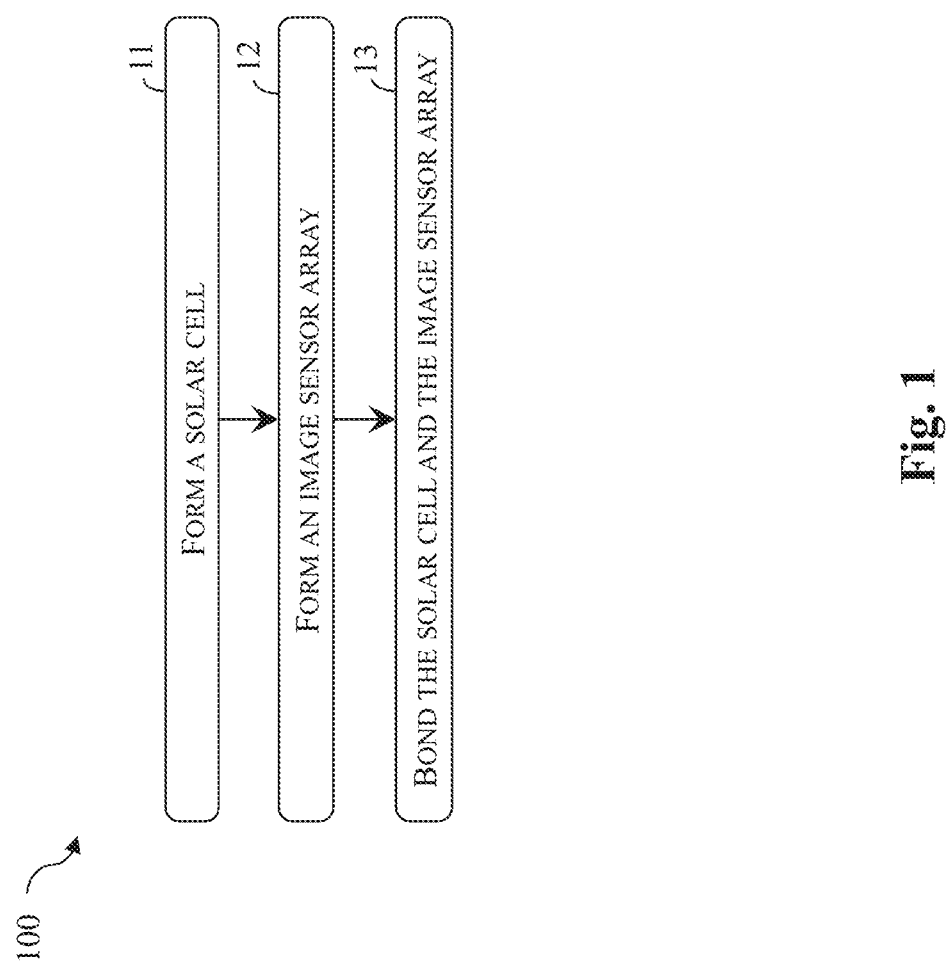
FIG. 1 is a flowchart illustrating a method 100 of fabricating a self-powered image sensor according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Complementary metal-oxide-semiconductor (CMOS) image sensors (CIS) have gained popularity in recent years. Fabrication of CIS sensors involves use of a wafer level carrier as a support carrier. To allow light transmission into the CIS sensors, the fabrication process also includes steps to grind and polish away a substantial thickness of the support carrier. It can be seen that while the support carrier serves its interim functions, its use may complicate the process and increases the production cost.

The present disclosure provides a process and a device structure that integrate a CIS sensor array with a solar cell. The substrate of the solar cell may function as a support substrate during the fabrication of the CIS sensor array. The solar cell not only serves as a support substrate, it can also function as a power supply for the CIS sensor array to form a self-sufficient package. In one example, direct current (DC) voltage generated by the solar cell may be stored in a metal-insulator-metal (MIM) capacitor as charges. Charges stored in the MIM capacitor can be stabilized and converted into alternating current (AC) signals by an inventor or an inverter circuit before supplied to the CIS sensor array.

The various aspects of the present disclosure will now be described in more detail with reference to the figures. In that regard, FIG. 1 is a flowchart illustrating method 100 of forming a self-powered image sensor according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 includes blocks 11, 12 and 13. Operations at block 11 are further described in a flowchart shown in FIG. 2. Operations at block 12 are further described in a flowchart shown in FIG. 11. Operations at block 13 are further described in a flowchart shown in FIG. 17. Operations at block 11 are described below in conjunction with FIGS. 3-10, which are fragmentary cross-sectional view of a first workpiece 200 at various stages of fabrication. Operations at block 12 are described below in conjunction with FIGS. 12-16, which are fragmentary cross-sectional view of a second workpiece 300 at various stages of fabrication. Operations at block 13 are described below in conjunction with FIGS. 18-25, which are fragmentary cross-sectional view of a third workpiece 400 at various stages of fabrication. FIGS. 26-32 illustrate alternative embodiments that include light reflectors or light redirecting features. Because the first workpiece 200 will be fabricated into a solar cell at the conclusion of the operations at block 11, the first workpiece 200 may also be referred to as a solar cell 200 or a photovoltaic cell 200 as the context requires. Because the second workpiece 300 will be fabricated into an image sensor or an image sensor array at the conclusion of the operations at block 12, the second workpiece 300 may also be referred to an image sensor 300 or an image sensor array 300 as the context requires. Because the workpiece 400 will be fabricated into a self-powered image sensor at the conclusion of the operations at block 13, the third workpiece 400 may also be referred to as a self-powered image sensor 400 as the context requires. Additionally, throughout the present application, like reference numerals denote like features, unless otherwise excepted. The X, Y and Z directions are used consistently in FIGS. 3-10, 12-16, 18-32 and are perpendicular to one another.

Referring first to FIG. 1, method 100 includes a block 11, a block 12, and a block 13. Operations at block 11 form a solar cell 200. Operations at block 12 form an image sensor array 300. Operations at block 13 bond the solar cell 200 formed at block 11 and the image sensor array 300 at block 12 to form a self-powered image sensor 400. Operations at blocks 11, 12, and 13 will be described separately.

Figure 2:
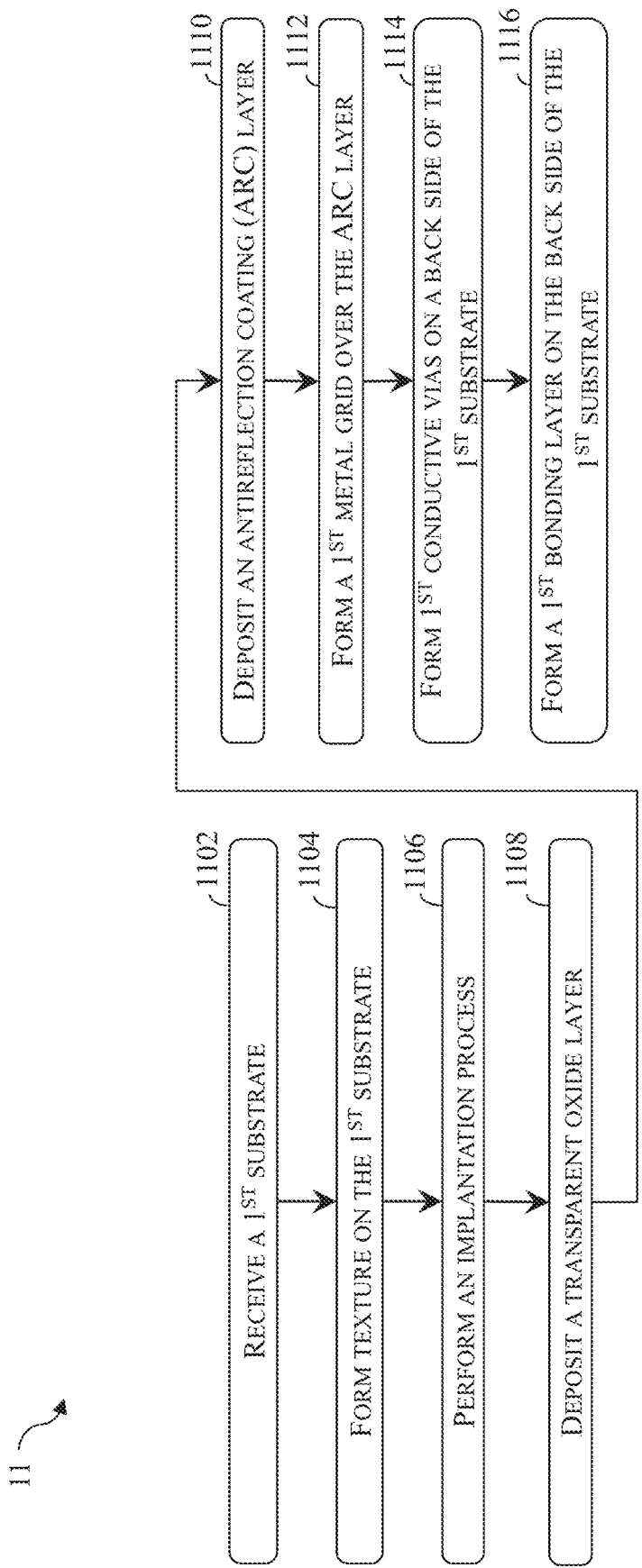
FIG. 2 is a flowchart illustrating operations in block 11 of method 100 of FIG. 1, according to various aspects of the present disclosure.
Figure 3:
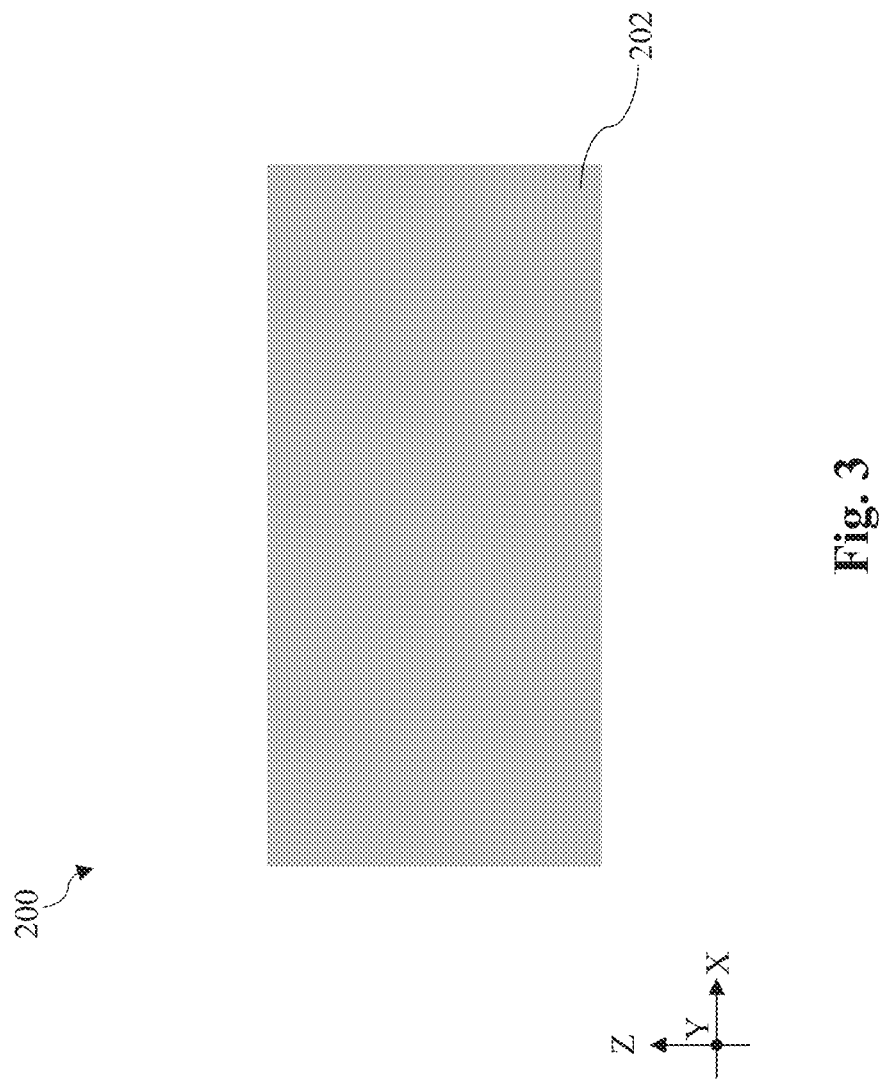
FIGS. 3-10 illustrate fragmentary cross-sectional views of a first workpiece 200 undergoing various stages of fabrication at block 11 of method 100, according to various aspects of the present disclosure.

Referring to FIGS. 2 and 3, block 11 of method 100 includes an operation 1102 where a first substrate 202 is received. The first substrate 202 may include silicon (Si). For example, the first substrate 202 may include single crystalline silicon, multi-crystalline silicon, or amorphous silicon. Alternatively, the first substrate 202 may include germanium (Ge) or a III-V semiconductor material. Example III-V semiconductor materials may include gallium arsenide (GaAs), gallium phosphide (GaP), indium phosphide (InP), indium arsenide (InAs), and/or indium antimonide (InSb), gallium arsenic phosphide (GaAsP), aluminum indium arsenide (AlInAs), aluminum gallium arsenide (AlGaAs), gallium indium arsenide (GaInAs), gallium indium phosphide (GaInP), or gallium indium arsenic phosphide (GaInAsP). In some implementations, the first substrate 202 may have a thickness along the Z direction and the thickness may be between about 50 μm and about 600 μm. In some alternative implementations, the thickness may be smaller than 50 μm or greater than 600 μm. In one embodiment, the first substrate 202 includes silicon and is doped with a p-type dopant, such as boron (B) or boron difluoride ($BF_2$).

Figure 4:
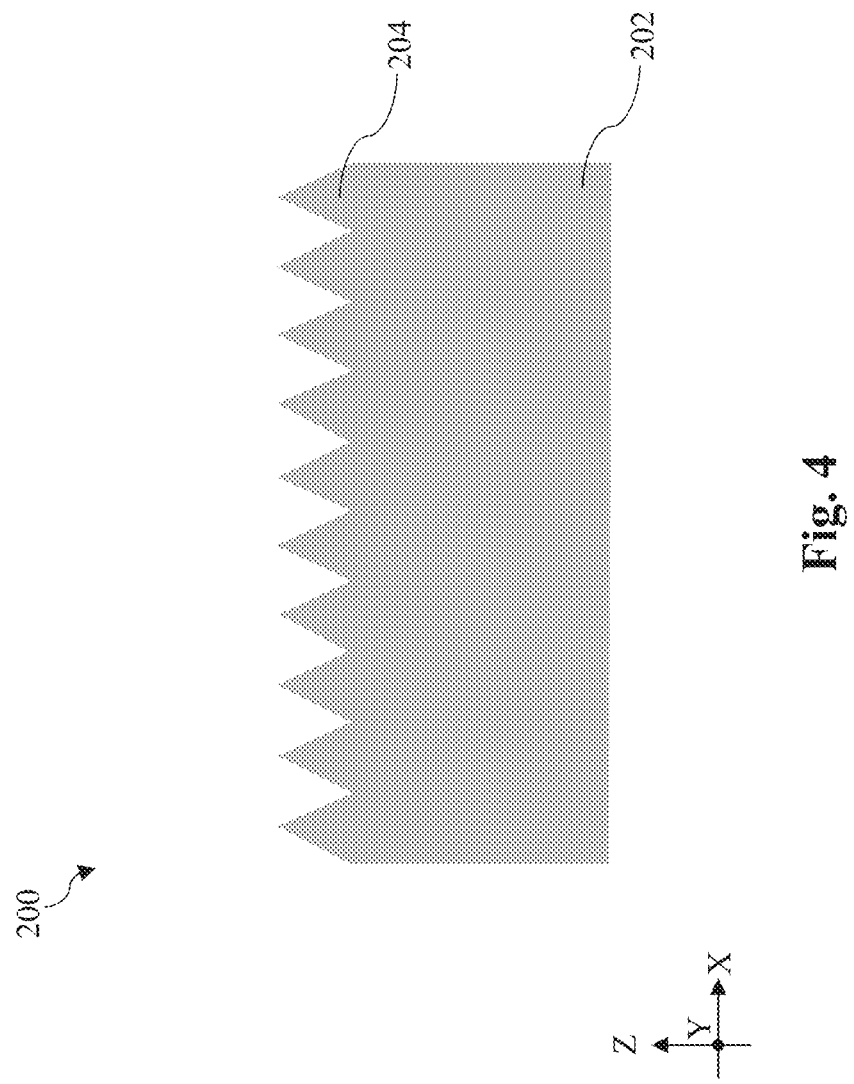

Referring to FIGS. 2 and 4, block 11 of method 100 includes an operation 1104 where a texture is formed on the first substrate 202. At operation 1104, a front surface of the first substrate 202 is treated with chemical etching or physical abrasion to form a textured surface 204 or surface texture 204. When the first substrate 202 is treated by chemical etching, the front surface of the first substrate 202 is immersed in an etchant. An example etchant may be an aqueous solution of potassium hydroxide (KOH), sodium hydroxide (NaOH), tetramethylammonium hydroxide (TMAH) or tetraethylammonium hydroxide (TEOH) or a combination thereof. When the first substrate 202 is treated with physical abrasion, the first substrate 202 may be subject to diamond wire sawing, multi-wire sawing, sandblasting, reactive ion etching (RIE), or laser sawing. Operation 114 is configured to form a pyramid like or scallop-like surface texture 204 that reduce reflectance of the first substrate 202.

Figure 5:
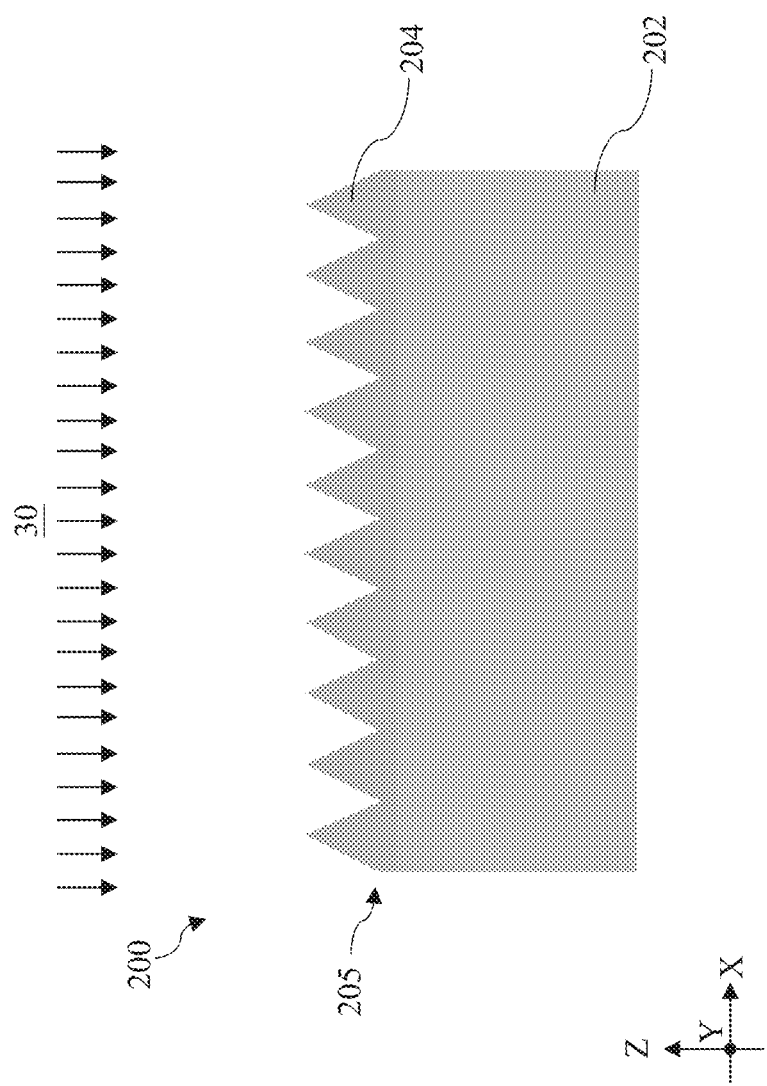

Referring to FIGS. 2 and 5, block 11 of method 100 includes an operation 1106 where an implantation process 30 is performed to the first substrate 202. The implantation process 30 is performed to form a heavily doped region 205 on a front surface of the first substrate 202. In some embodiments, the implantation process 30 implants an n-type dopant, such as phosphorus (P) or arsenic (As). The heavily doped region 205 functions to reduce contact resistance between metal contacts and the front surface of the first substrate 202. As shown in FIG. 5, because both the surface texture 204 and the heavily doped region 205 are adjacent the front surface of the first substrate 202, the surface texture 204 is disposed in the heavily doped region 205. In some instances, the heavily doped region 205 may have a thickness between about 0.50 μm and about 1 μm. A ratio of the thickness of the heavily doped region 205 to the thickness of the first substrate 202 may be between about 1:50 and about 1:600. In some alternative implementations, the heavily doped region 205 may have greater or smaller thicknesses and the ratio of the thickness of the heavily doped region 205 to the thickness of the first substrate 202 may be greater than 1:50.

Figure 6:
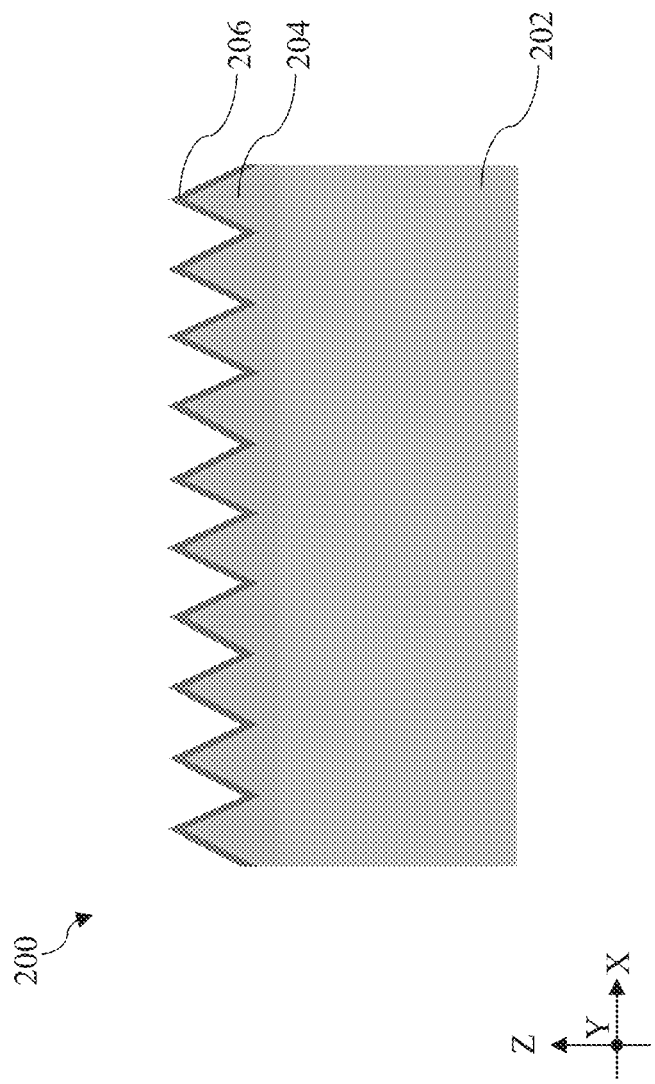

Referring to FIGS. 2 and 6, block 11 of method 100 includes an operation 1108 where a transparent oxide layer 206 is deposited on the first workpiece 200. The transparent oxide layer 206 is formed of electrically conductive transparent oxide. For that reason, the transparent oxide layer 206 may be referred to as the transparent conductive oxide (TCO) layer 206. In some embodiments, the transparent oxide layer 206 may include indium tin oxide (ITO), zinc oxide (ZnO), fluorine-doped tin oxide (FTO), indium zinc oxide (IZO), aluminum-doped zinc oxide (AZO), boron-doped zinc oxide (BZO), or gallium zinc oxide (GZO). In some embodiments, the transparent oxide layer 206 may be deposited using chemical vapor deposition (CVD), physical vapor deposition (PVD), spray-pyrolysis, sol-gel deposition, or atomic layer deposition (ALD). In one embodiment, the transparent oxide layer 206 is deposited using PVD. The transparent oxide layer 206 is transparent to allow light into the solar cell for energy conversion and acts as a collector of energy converted by the solar cell.

Figure 7:
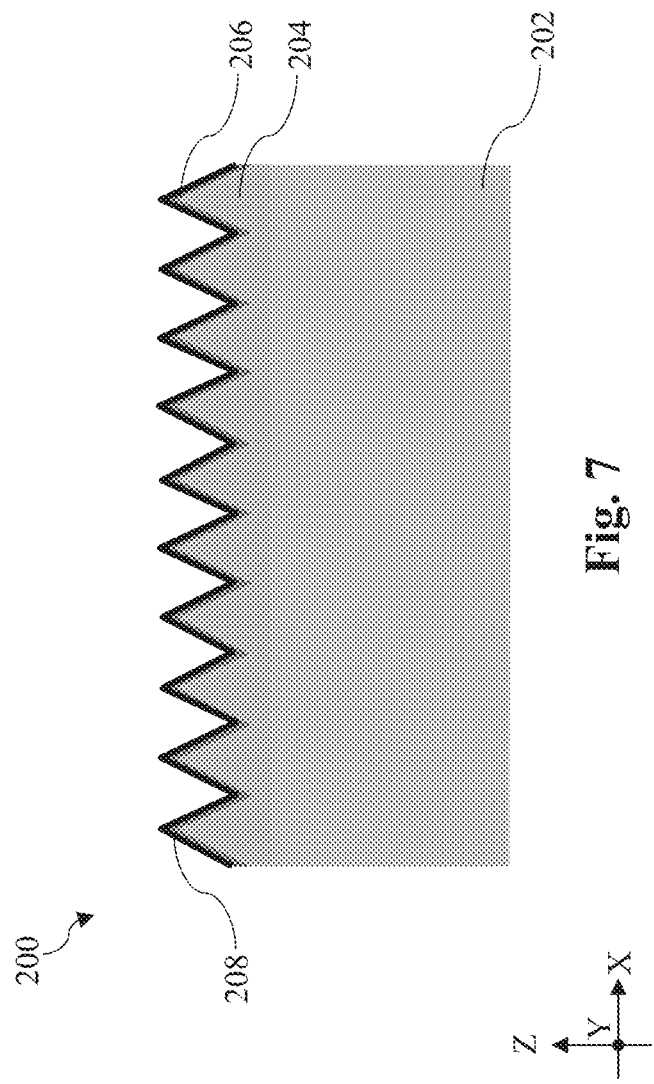

Referring to FIGS. 2 and 7, block 11 of method 100 includes an operation 1110 where an anti-reflection coating (ARC) layer 208 is deposited on the first workpiece 200. The ARC layer 208 may include silicon nitride, silicon oxide, titanium oxide, aluminum oxide, or silicon carbide. In one embodiment, the ARC layer 208 includes silicon nitride. In some implementations, the ARC layer 208 is deposited using plasma-enhanced CVD (PECVD), atmospheric pressure CVD (APCVD), or ALD. The ARC layer 208 helps to increase the light transmittance into the solar cell.

Figure 8:
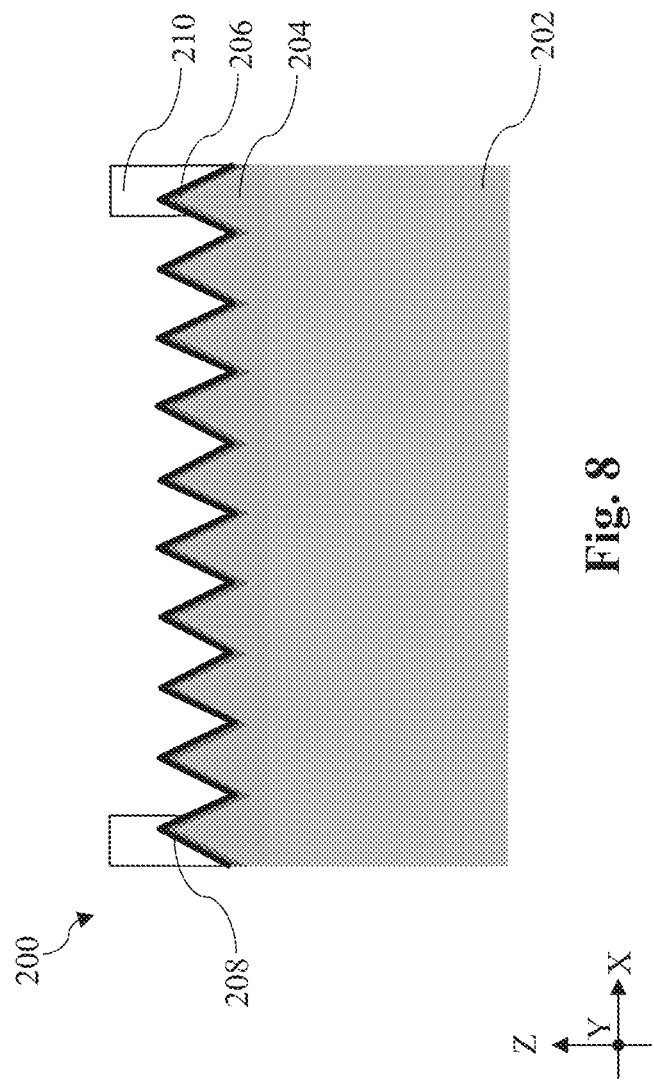

Referring to FIGS. 2 and 8, block 11 of method 100 includes an operation 1112 where a first metal grid 210 is formed on the ARC layer 208. The first metal grid 210 serves as a current spreading electrode. In some embodiments, the first metal grid 210 is formed of a highly conductive metal, such as silver (Ag), copper (Cu), aluminum (Al), or a combination thereof. In one embodiment, the first metal grid 210 is formed of silver (Ag). In some implementations, the first metal grid 210 may be formed using inkjet printing, screen printing, or nanoparticle self-assembly. In some alternative embodiments, a silver starter grid is first formed using screen printing and copper is electroplated onto the silver starter grid to form the first metal grid 210. In those alternative embodiments, the first metal grid 210 may include both silver (Ag) and copper (Cu). While not explicitly shown in the figures, a laser etching process may be performed to locations where the first metal grid 210 is going to land so as to expose the transparent oxide layer 206. This way, the first metal grid 210 is electrically coupled to the transparent oxide layer 206.

Figure 9:
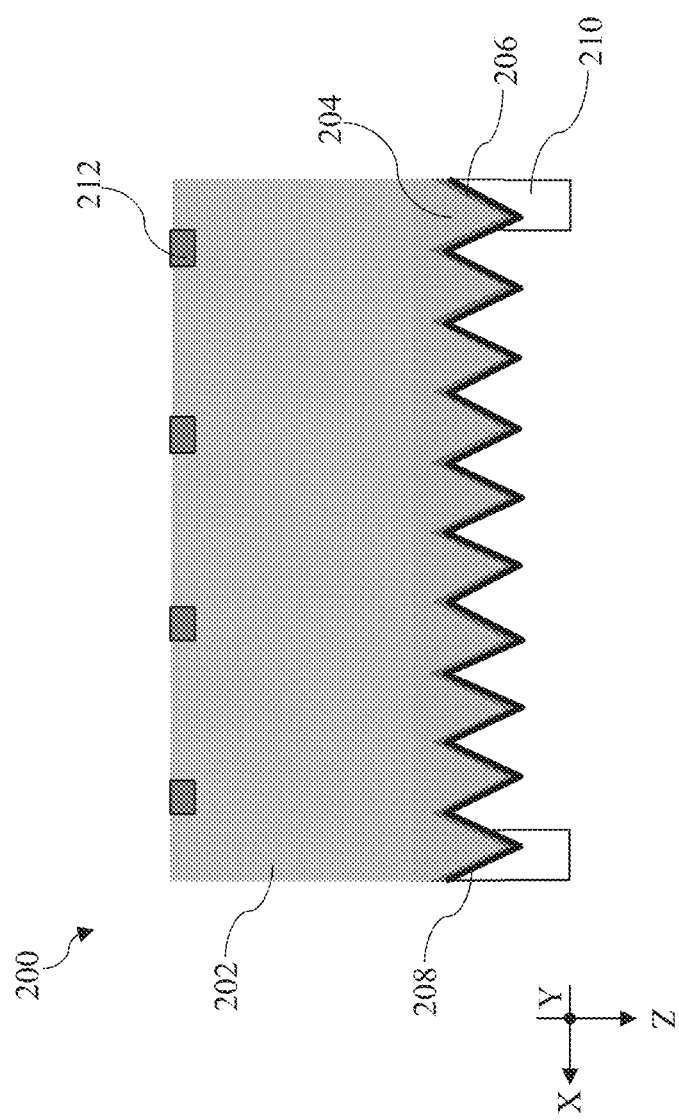

Referring to FIGS. 2 and 9, block 11 of method 100 includes an operation 1114 where first conductive vias 212 are formed on a back side of the first substrate 202. As shown in FIG. 9, operation 1114 includes turning the first workpiece 200 upside-down such that the back side of the first substrate 202 is facing up. Then photolithography processes and etch processes are used to form via openings on the back side of the first substrate 202. In an example process, a photoresist layer is deposited over the back side of the first substrate 202. The photoresist layer undergoes an pre-exposure baking process, exposure to radiation reflected from or transmitted through a photomask, a post-exposure baking process, and developing process, so as to form a patterned photoresist layer. The patterned photoresist layer is then applied as an etch mask to etch the via openings. The etching of the via openings into the first substrate 202 may be performed using a dry etch process that includes use of an inert gas (e.g., Ar) a fluorine-containing gas (e.g., $CF_4$, $C_2F_6$, $SF_6$ or $NF_3$), other suitable gases and/or plasmas, and/or combinations thereof. A metal fill layer is then deposited in the via openings. In some instances, the metal fill layer may include silver (Ag), copper (Cu), or aluminum (Al). In one embodiment, the metal fill layer may include silver (Ag). After the deposition, a planarization process, such as a chemical mechanical polishing (CMP) process, is performed to remove excess metal fill layer over the back side of the first substrate 202. At this point, the first conductive vias 212 are formed.

Figure 10:
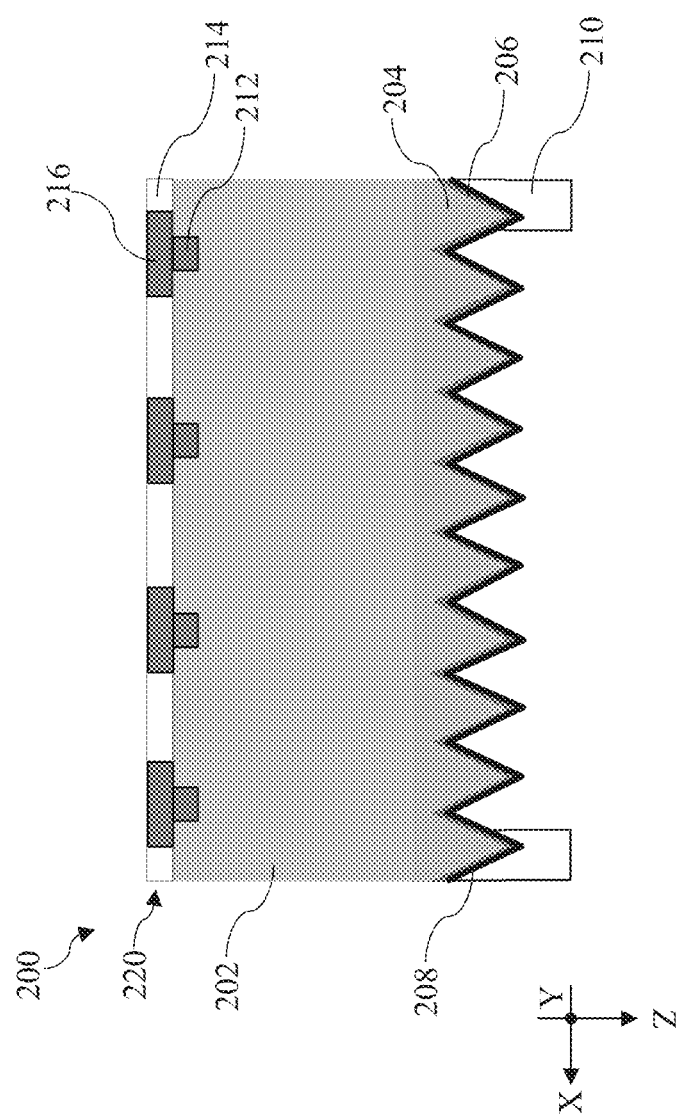

Referring to FIGS. 2 and 10, block 11 of method 100 includes an operation 1116 where a first bonding layer 220 is formed over the back side of the first substrate 202. As will be described further below, the first bonding layer 220 provides bonding surfaces and allows inter-substrate communication. In some embodiments represented in FIG. 10, the first bonding layer 220 includes first contact features 216 disposed in a first dielectric layer 214. The first dielectric layer 214 may include silicon oxide or silicon oxynitride. The first contact features 216 may include copper (Cu), tantalum (Ta), nickel (Ni), cobalt (Co), aluminum (Al), a combination thereof, or an alloy thereof. In one embodiment, the first contact features 216 includes copper (Cu).

Figure 11:
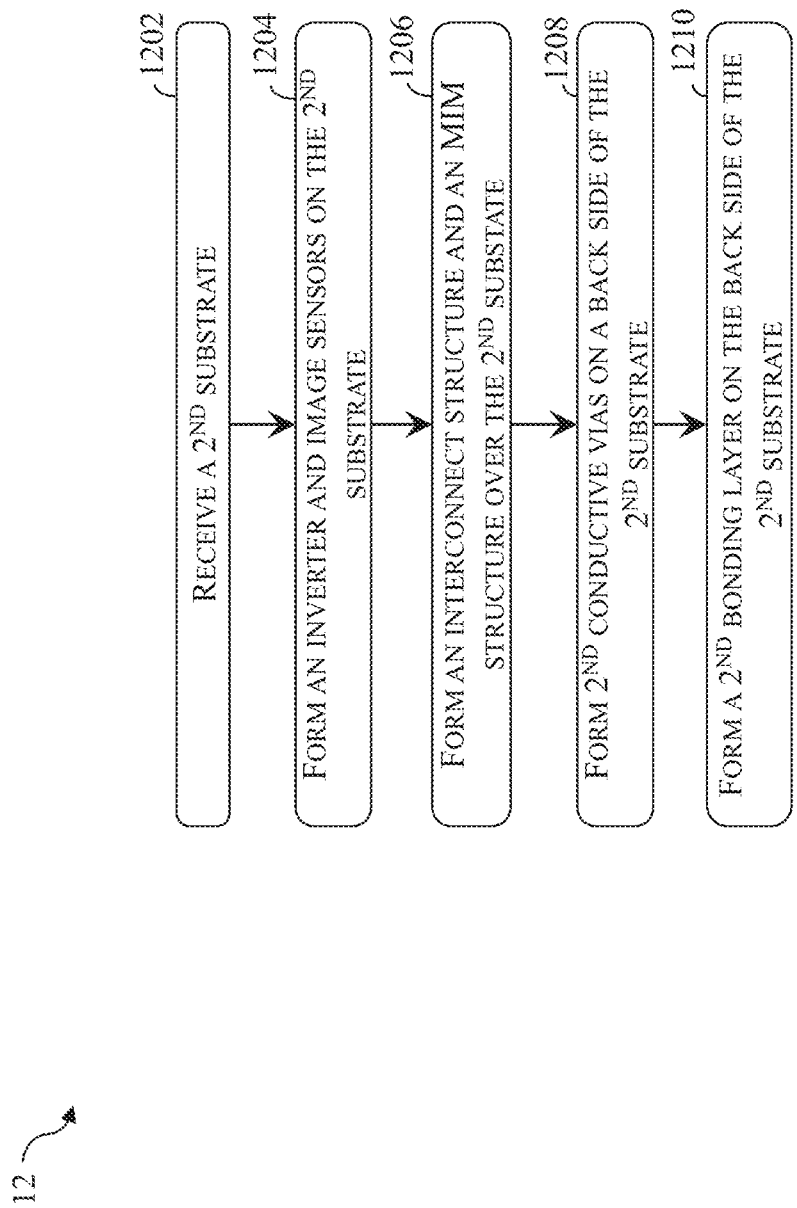
FIG. 11 is a flowchart illustrating operations in block 12 of method 100 of FIG. 1, according to various aspects of the present disclosure.
Figure 12:
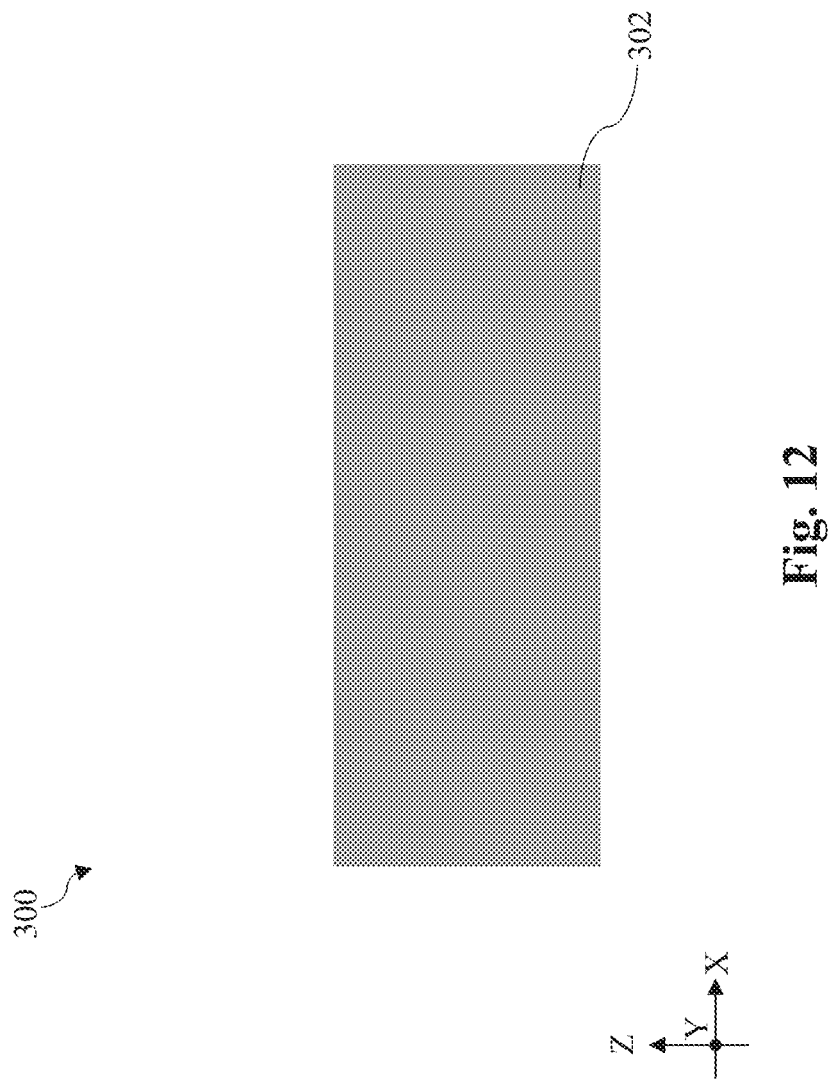
FIGS. 12-16 illustrate fragmentary cross-sectional views of a second workpiece 300 undergoing various stages of fabrication at block 12 of method 100, according to various aspects of the present disclosure.

Reference is now made to FIG. 11, which illustrates operations in block 12 of method 100. As shown in FIG. 11, block 12 include operations 1202, 1204, 1206, 1208, and 1210. Referring to FIGS. 11 and 12, block 12 of method 100 includes an operation 1202 where a second substrate 302 is received. The second substrate 302 may include silicon (Si). Alternatively, the second substrate 302 may include germanium (Ge) or silicon germanium (SiGe). In some implementations, the first substrate 202 may have a thickness along the Z direction and the thickness may be between about 50 μm and about 600 μm. In some alternative implementations, the thickness may be smaller than 50 μm or greater than 600 μm. In one embodiment, the first substrate 202 includes silicon and is doped with a p-type dopant, such as boron (B) or boron difluoride ($BF_2$).

Figure 13:
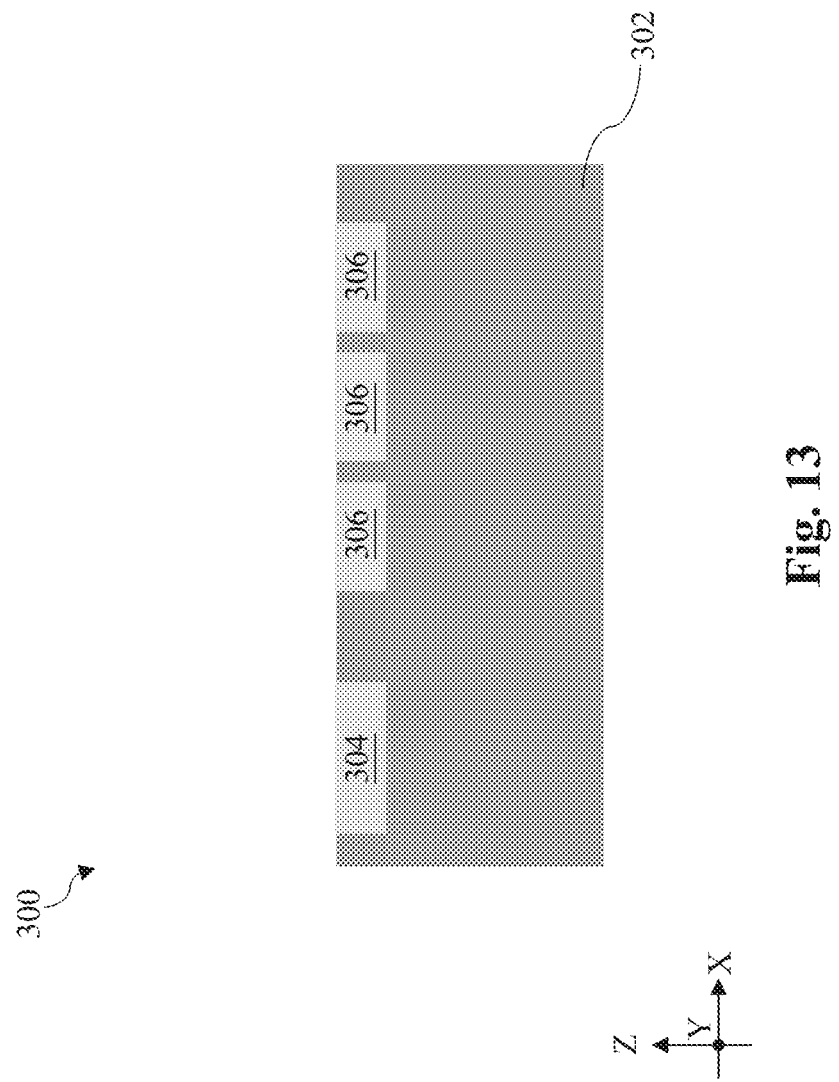

Referring to FIGS. 11 and 13, block 12 of method 100 includes an operation 1204 where an inverter 304 and a plurality of image sensors 306 are formed on the second substrate 302. It is noted that the inverter 304 may represent an inverter circuit that is configured to convert DC voltage to AC signals. The inverter 304 and each of the image sensors 306 may include transistors. The transistors in the inverter 304 and the image sensors 306 may be planar transistors or multi-gate transistors, such as fin-like field effect transistor (FinFETs) or gate-all-around (GAA) transistors. A planar transistor includes a gate structure that may induce a planar channel region along one surface of its active region, hence its name. A FinFET includes a fin-shaped active region arising from a substrate and a gate structure disposed over a top surface and sidewalls of the fin-shaped active region. A GAA transistor includes at least one channel member extending between two source/drain features and a gate structure that wraps completely around the at least one channel member. Because its gate structure wraps around the channel member, a GAA transistor may also be referred to as a surrounding gate transistor (SGT). Depending on the shapes and orientation, a channel member in a GAA transistor may be referred to as a nanosheet, a semiconductor wire, a nanowire, a nanostructure, a nano-post, a nano-beam, or a nano-bridge. In some instances, a GAA transistor may be referred to by the shape of the channel member. For example, a GAA transistor having one or more nanosheet channel member may also be referred to as a nanosheet transistor or a nanosheet FET. The image sensors 306 include photodiodes defined in the second substrate 302 by isolation features, such as deep trench isolation (DTI) features. The DTI features may include a dielectric material, a metal, or a combination thereof. The dielectric material in the DTI features is configured to enhance absorption. The metal in the DTI features is configured to reflect light (e.g., electromagnetic radiation) to improve efficiency.

Figure 14:
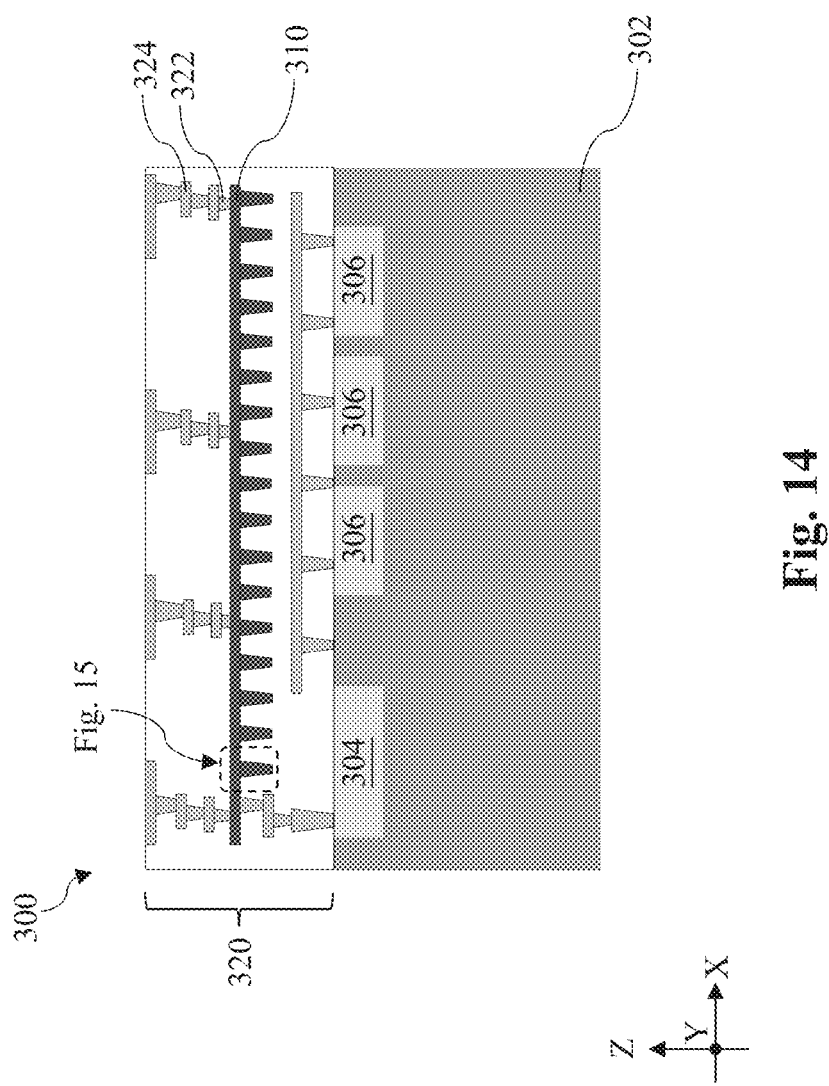

Referring to FIGS. 11 and 14, block 12 of method 100 includes an operation 1206 where an interconnect structure 320 and a metal-insulator-metal (MIM) structure 310 are formed over the second substrate 302. The interconnect structure 320 may also be referred to as a multi-layered interconnect (MLI) structure 320. The interconnect structure 320 provides interconnections (e.g., wiring) between the various microelectronic components of the inverter 304 and image sensors 306. The interconnect structure 320 may include multiple metal layers or metallization layers. In some instances, the interconnect structure 320 may include three (3) to sixth (6) metal layers. Each of the metal layers includes multiple conductive components embedded in an intermetal dielectric (IMD) layer. The conductive components may include contacts, vias, or metal lines and may include copper (Cu), titanium nitride (TiN), or a combination thereof. The IMD layer may be a silicon oxide or silicon-oxide-containing material where silicon exists in various suitable forms. As an example, the IMD layer includes silicon oxide or a low-k dielectric material having k-value (dielectric constant) smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOC), spin-on silicon based polymeric dielectrics, or combinations thereof.

Figure 15:
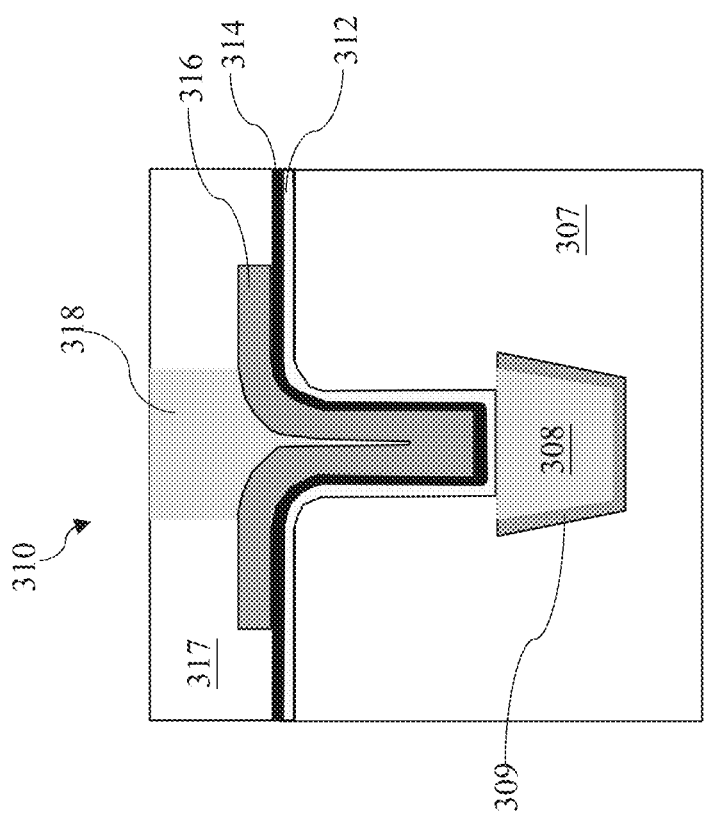

The interconnect structure 320 includes the MIM structure 310 and operation 1206 also includes formation of the MIM structure 310. To better illustrates the MIM structure 310, a dotted line area of the MIM structure 310 is enlarged and shown in FIG. 15. As shown in FIG. 15, The MIM structure 310 is disposed in one of the metal layers of the interconnect structure 320, except for the first or last three to four metal layers. In FIG. 15, a metal line 308 is part of the metal layer below the MIM structure 310 and is disposed in a lower IMD layer 307. The metal line 308 is spaced apart from the lower IMD layer 307 by a barrier layer 309. In the depicted embodiment, the metal line 308 includes copper and the barrier layer 309 includes titanium nitride. The MIM structure 310 includes a capacitor bottom metal (CBM) layer 312, an insulator layer 314 over the CBM layer 312, and a capacitor top metal (CTM) layer 316 over the insulator layer 314. The CBM layer 312 extends along a top surface of the lower IMD layer 307 and along surfaces of a trench formed directly over the metal line 308. The insulator layer 314 is conformally disposed along surfaces of the CBM layer 312 and the CTM layer 316 conformally extends along surfaces of the insulator layer 314. The trench functions to increase the overlapping areas of the CBM layer 312, the insulator layer 314 and the CTM layer 316 to increase the capacitance of the MIM structure 310. In some embodiments, the CBM layer 312 and the CTM layer 316 may include titanium (Ti), titanium nitride (TiN), tantalum (Ta), tantalum nitride (TaN), copper (Cu), a copper alloy, aluminum (Al), an aluminum (Al) alloy, copper aluminum alloy (AlCu), tungsten (W), or a combination thereof. In one embodiment, the CBM layer 312 and the CTM layer 316 may include titanium nitride (TiN). The insulator layer 314 may include hafnium oxide, zinc oxide, zirconium oxide, aluminum oxide, or a combination thereof. The CBM layer 312 and the CTM layer 316 may be deposited using physical vapor deposition (PVD) or chemical vapor deposition (CVD). The insulator layer 314 may be deposited using CVD or atomic layer deposition (ALD). After the formation of the MIM structure 310, an upper IMD layer 317 may be deposited over the MIM structure 310. A contact via 318 may be deposited in the upper IMD layer 317 to electrically couple to the CTM layer 316. While FIG. 15 only shows a single trench, the MIM structure 310 may span over surfaces of more than one trench, as representatively shown in FIG. 14. The MIM structure 310 shown in FIGS. 14 and 15 includes a three-dimensional structure and may be referred to as a three-dimensional MIM (3D MIM) capacitor. While 3D MIM capacitor is used here because it is compact and has good energy density, other MIM construction or even other capacitor structure can be used here as well.

Figure 16:
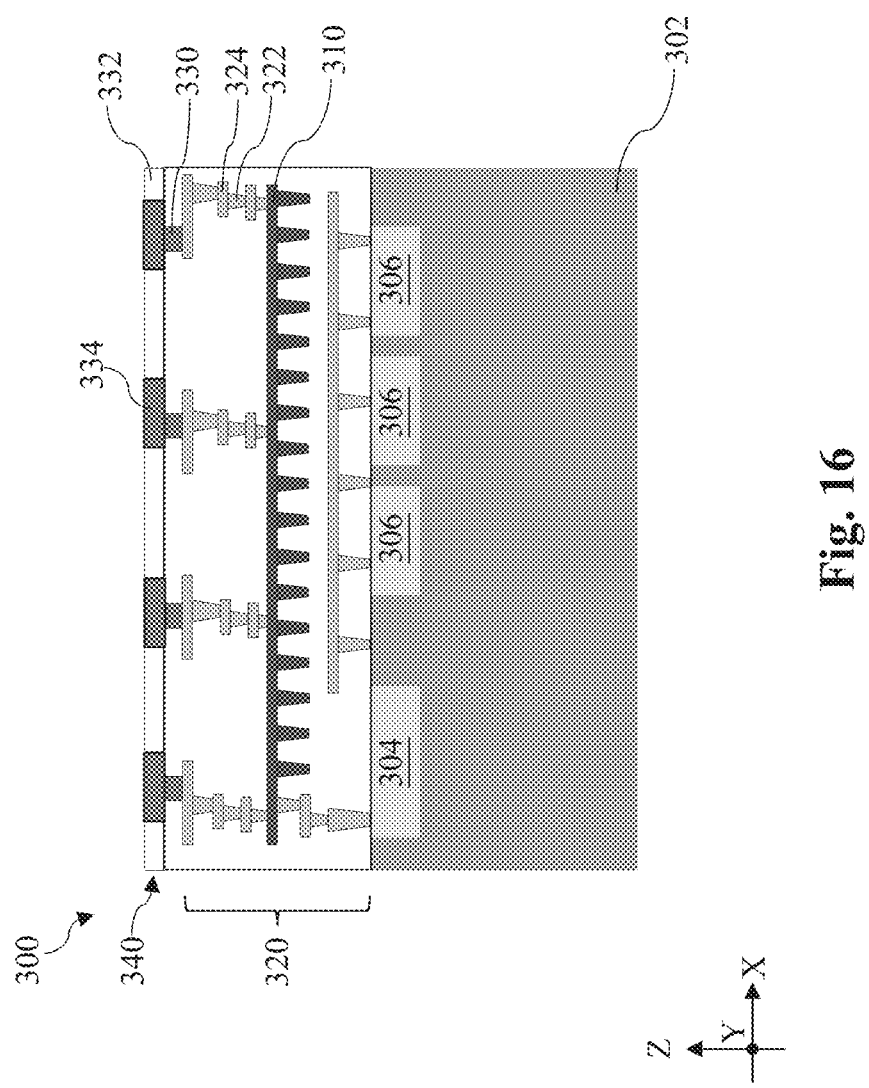

Referring to FIGS. 11 and 16, block 12 of method 100 includes an operation 1208 where second conductive vias 330 are formed on a back side of the second substrate 302. The second conductive vias 330 function to redirect electrical signals to interface the second bonding layer 340 (to be described below). As shown in FIG. 16, during operation 1208, a top IMD layer is deposited over the interconnect structure 320 and the second conductive vias 330 are formed in the top IMD layer. The top IMD layer may include silicon oxide, a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOC), spin-on silicon based polymeric dielectrics, or combinations thereof. The second conductive vias 330 may include copper and titanium nitride.

Referring to FIGS. 11 and 16, block 12 of method 100 includes an operation 1210 where a second bonding layer 340 is formed over a back side of the second substrate 302. The second bonding layer 340 is a counterpart of the first bonding layer 220 and is configured to allow inter-substrate communication. In some embodiments represented in FIG. 16, the second bonding layer 340 includes second contact features 334 disposed in a second dielectric layer 332. The second dielectric layer 332 may include silicon oxide or silicon oxynitride. The second contact features 334 may include copper (Cu), tantalum (Ta), nickel (Ni), cobalt (Co), aluminum (Al), a combination thereof, or an alloy thereof. In one embodiment, the second contact features 334 includes copper (Cu). As will be described below, when the second workpiece 300 and the first workpiece 200 is bonded together, each of the first contact features 216 is substantially vertically aligned with one of the second contact features 334.

Figure 17:
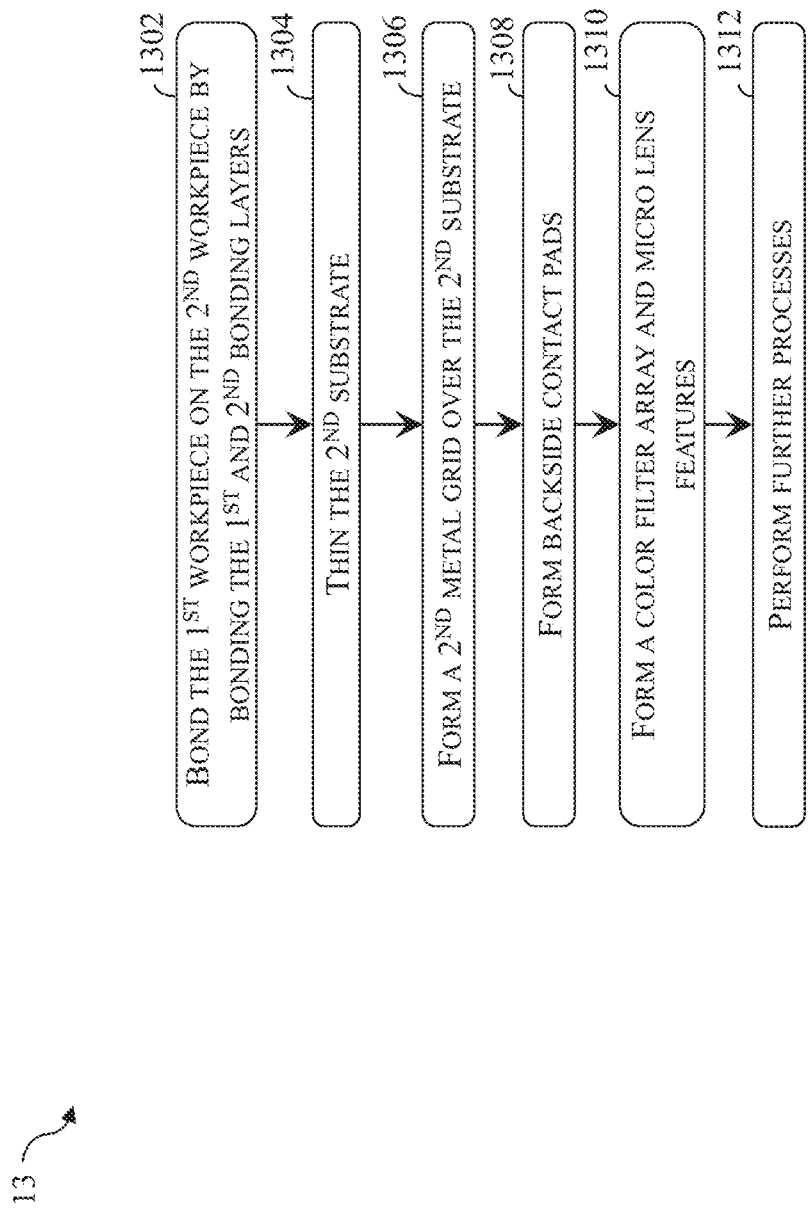
FIG. 17 is a flowchart illustrating operations in block 13 of method 100 of FIG. 1, according to various aspects of the present disclosure.
Figure 18:
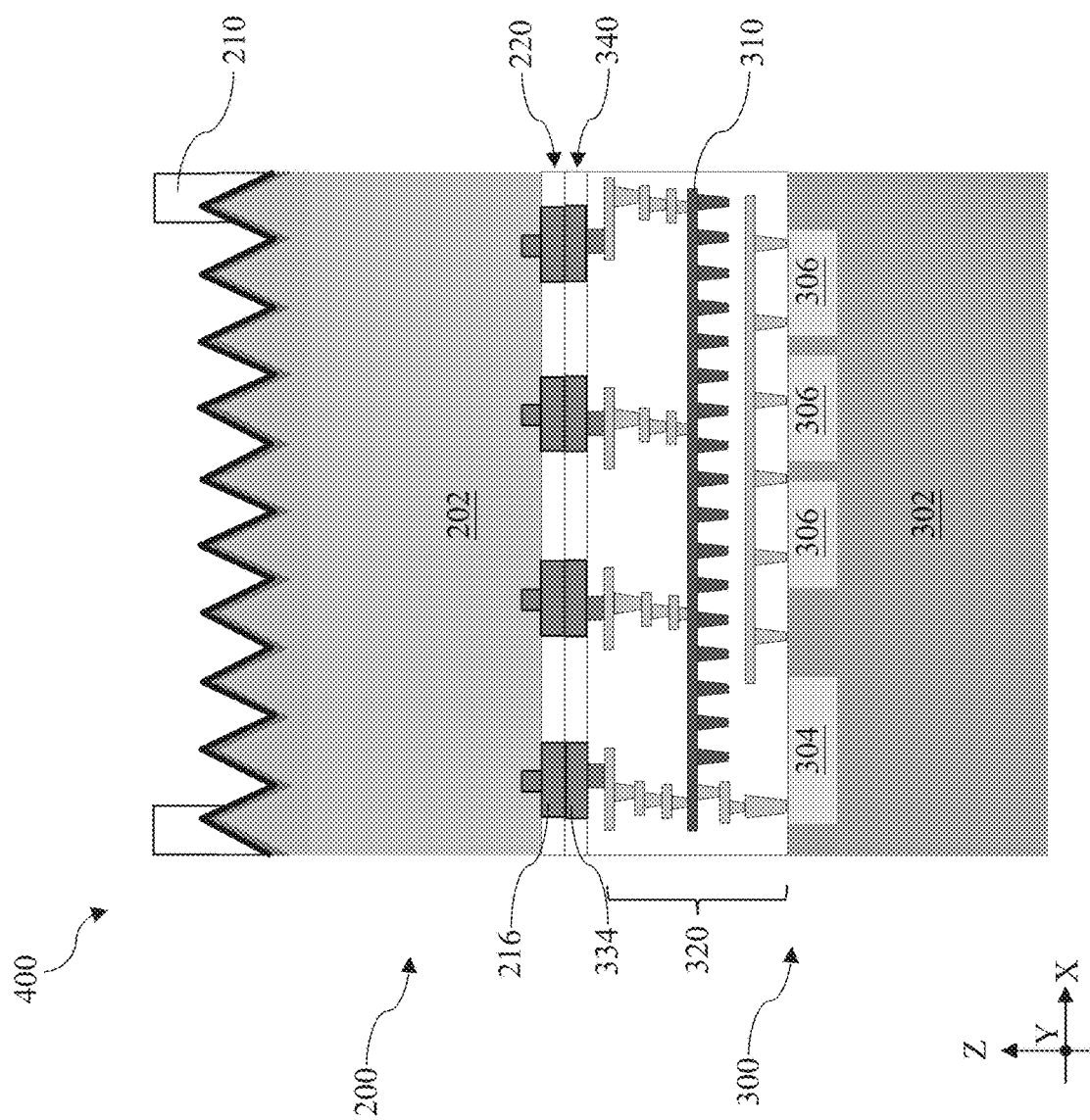
FIGS. 18-25 illustrate fragmentary cross-sectional views of a third workpiece 400 undergoing various stages of fabrication at block 13 of method 100, according to various aspects of the present disclosure.

Reference is now made to FIG. 17, which illustrates operations in block 13 of method 100. As shown in FIG. 17, block 13 include operations 1302, 1304, 1306, 1308, 1310, and 1312. Referring to FIGS. 17 and 18, block 13 of method 100 includes an operation 1302 where the first workpiece 200 and the second workpiece 300 are bonded together by bonding the first bonding layer 220 to the second bonding layer 340. In operation 1302, the first workpiece 200 is bonded to the second workpiece 300 to form a third workpiece 400. To ensure a strong bonding between the first bonding layer 220 and the second bonding layer 340, surfaces of the first bonding layer 220 and the second bonding layer 340 are cleaned to remove organic and metallic contaminants. In an example process, a sulfuric acid hydrogen peroxide mixture (SPM), a mixture of ammonium hydroxide and hydrogen peroxide (SC1), or both are used to remove organic contaminants on the first bonding layer 220 and the second bonding layer 340. A mixture of hydrochloric acid and hydrogen peroxide (SC2) may be used to remove metallic contaminants. Besides cleaning, the first contact features 216 and the second contact features 334 may be treated by an argon plasma or a nitrogen plasma to activate the surfaces thereof. After the second contact features 334 in second bonding layer 340 are aligned with the first contact features 216 in the first bonding layer 220, an anneal is performed to promote the van der Waals force bonding of the first dielectric layer 214 and the second dielectric layer 332 as well as the surface-activated bonding (SAB) of the first contact features 216 and the second contact features 334. In some instances, the anneal includes a temperature between about 200° C. and about 300° C.

Figure 19:
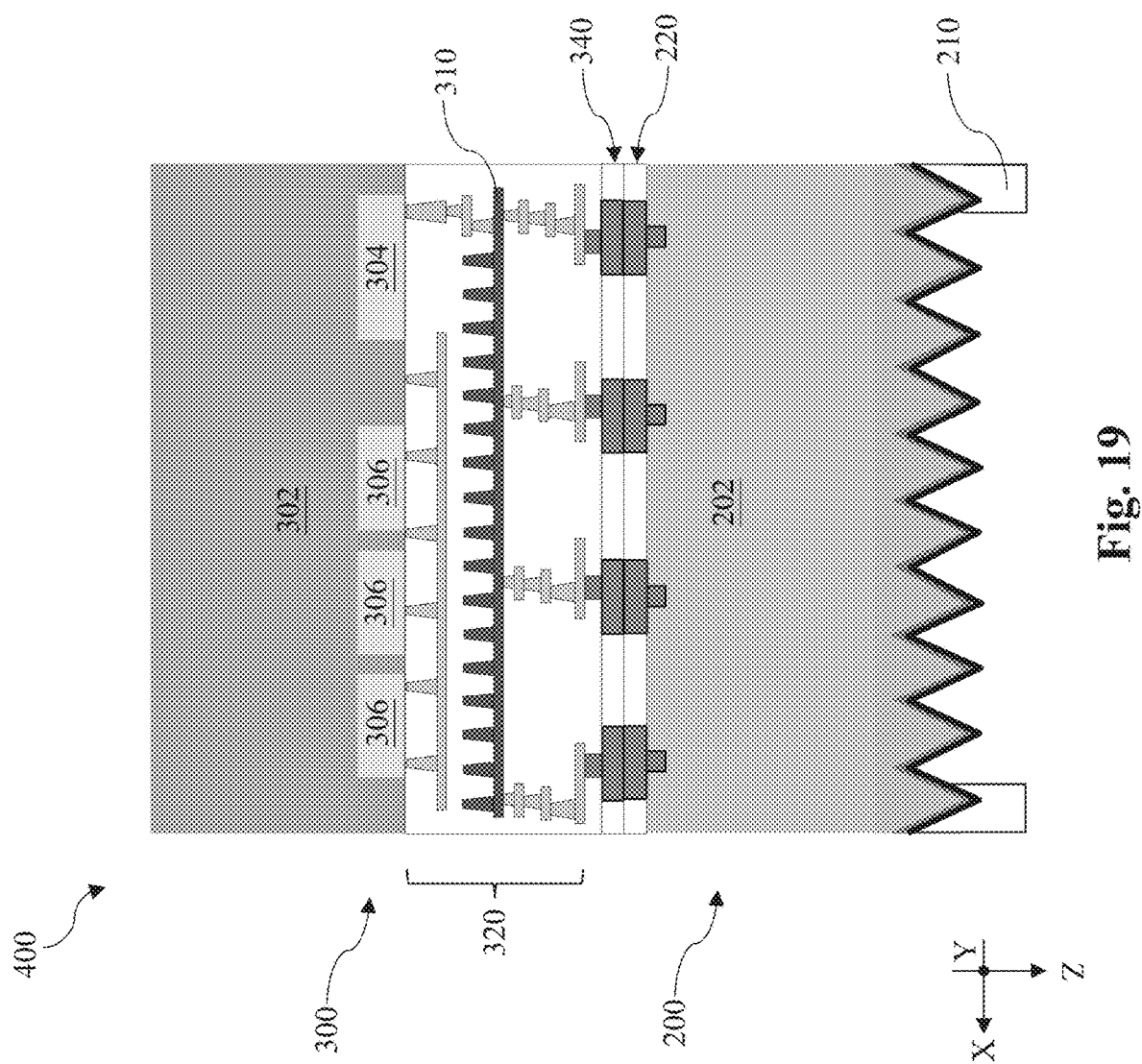
Figure 20:
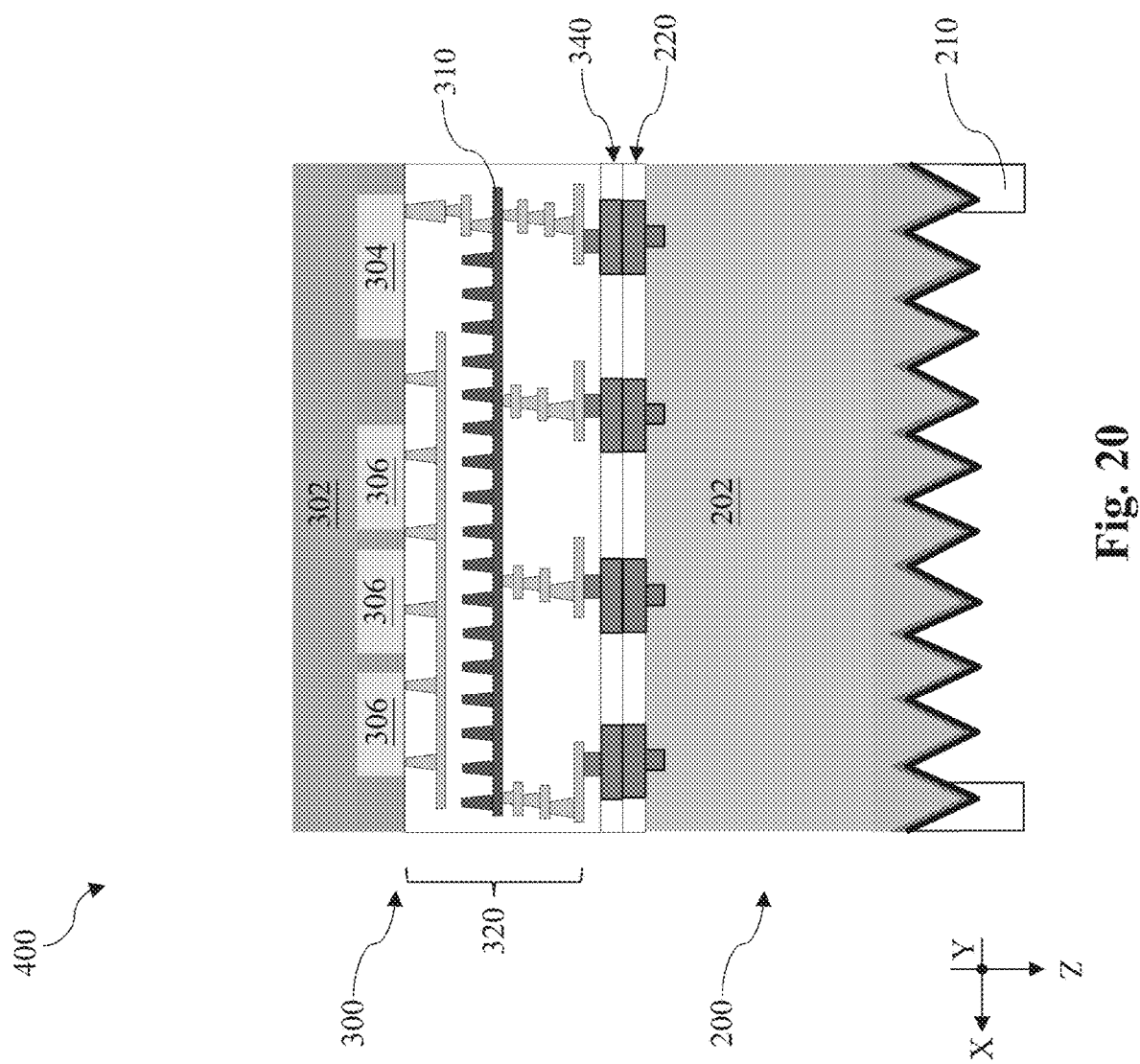

Referring to FIGS. 17, 19 and 20, block 13 of method 100 includes an operation 1304 where the second substrate 302 is thinned. As shown in FIG. 19, after the first workpiece 200 is bonded to the second workpiece 300 to form the third workpiece 400, the third workpiece 400 is flipped upside down such that the second substrate 302 is on top of the third workpiece 400. In operation 1304, third workpiece 400 may undergo multiple thinning and polishing steps to reduce the thickness of the second substrate 302, as shown in FIG. 20. In an example process, diamond wheels may be used to perform coarse grinding, fine grinding, or super fine grinding and a chemical mechanical polishing (CMP) process may be performed to polishing the ground second substrate 302. In some embodiments, the second substrate 302 may be thinned to a total thickness between about 1 µm and about 8 µm. This thickness range is not trivial When the total thickness of the second substrate 302 is smaller than 1 µm, photoelectric conversion is not good and color saturation may be reduced. When the total thickness of the second substrate 302 is about 8 µm, the resulting image sensor may sense visible light already. It is unnecessary for the second substrate 302 to be thicker. In some alternative embodiments, the second substrate 302 may have a total thickness greater than 8 µm.

Figure 21:
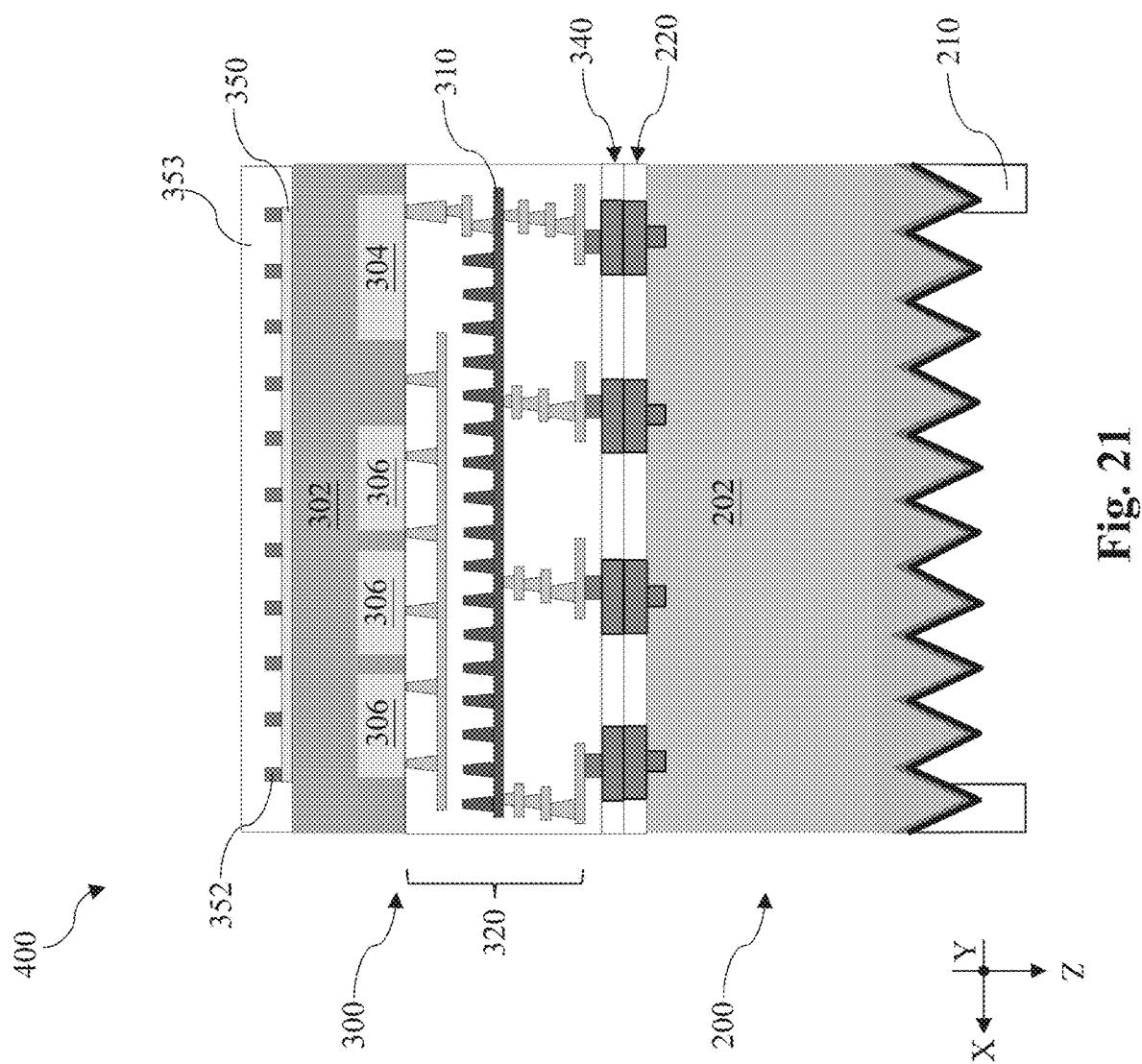

Referring to FIGS. 17 and 21, block 13 of method 100 includes an operation 1306 where a second metal grid 352 is formed over the second substrate 302. The second metal grid 352 forms a framework that extends over several, if not all, of plurality of image sensors 306. In some implementations, the second metal grid 352 corresponds to boundaries of the image sensors 306 to define light passage openings to image sensors 306. In some embodiments, the second metal grid 352 may include tin (Sn), aluminum-copper (AlCu), aluminum (Al), tungsten (W), ruthenium (Ru), cobalt (Co), or copper (Cu). In one embodiment, the second metal grid 352 is formed of tin (Sn). The second metal grid 352 may physically block light reflection among adjacent image sensors and prevent cross-talk among neighboring image sensors. In an example process to form the second metal grid 352, a metal layer is deposited over the third workpiece 400. Then photolithography process and etch processes are used to pattern the metal layer into the second metal grid 352. In some embodiments represented in FIG. 21, the second metal grid 352 is formed on a first passivation layer 350. The first passivation layer 350 may include silicon oxide and may be deposited over the second workpiece 300 using chemical vapor deposition (CVD). After the formation of the second metal grid 352, a second passivation layer 353 is deposited over the second metal grid 352. In some instances, the second passivation layer 353 may include silicon oxide and may be deposited over the second workpiece 300 using CVD.

Figure 22:
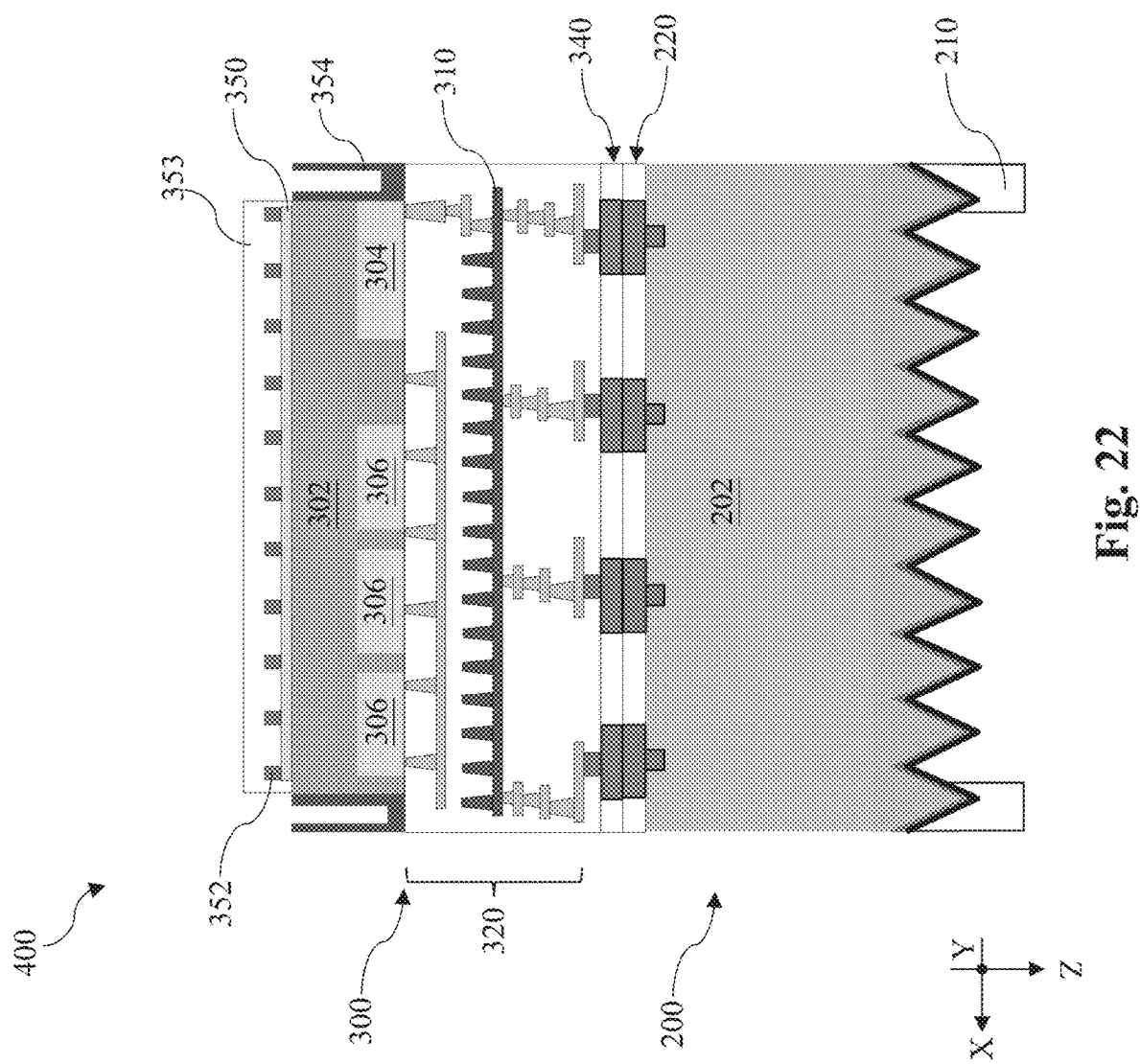

Referring to FIGS. 17 and 22, block 13 of method 100 includes an operation 1308 where backside contact pads 354 are formed. To allow electrical connection through the thickness of the second substrate 302, the second substrate 302 is saw along scribe lines to form openings that expose contact features in the interconnect structure 320. Thereafter, a metal layer is deposited over the openings to form the backside contact pads 354. In some embodiments, the metal layer for the backside contact pads 354 may include copper (Cu), aluminum (Al), an aluminum-copper (AlCu) alloy, or titanium nitride.

Figure 23:
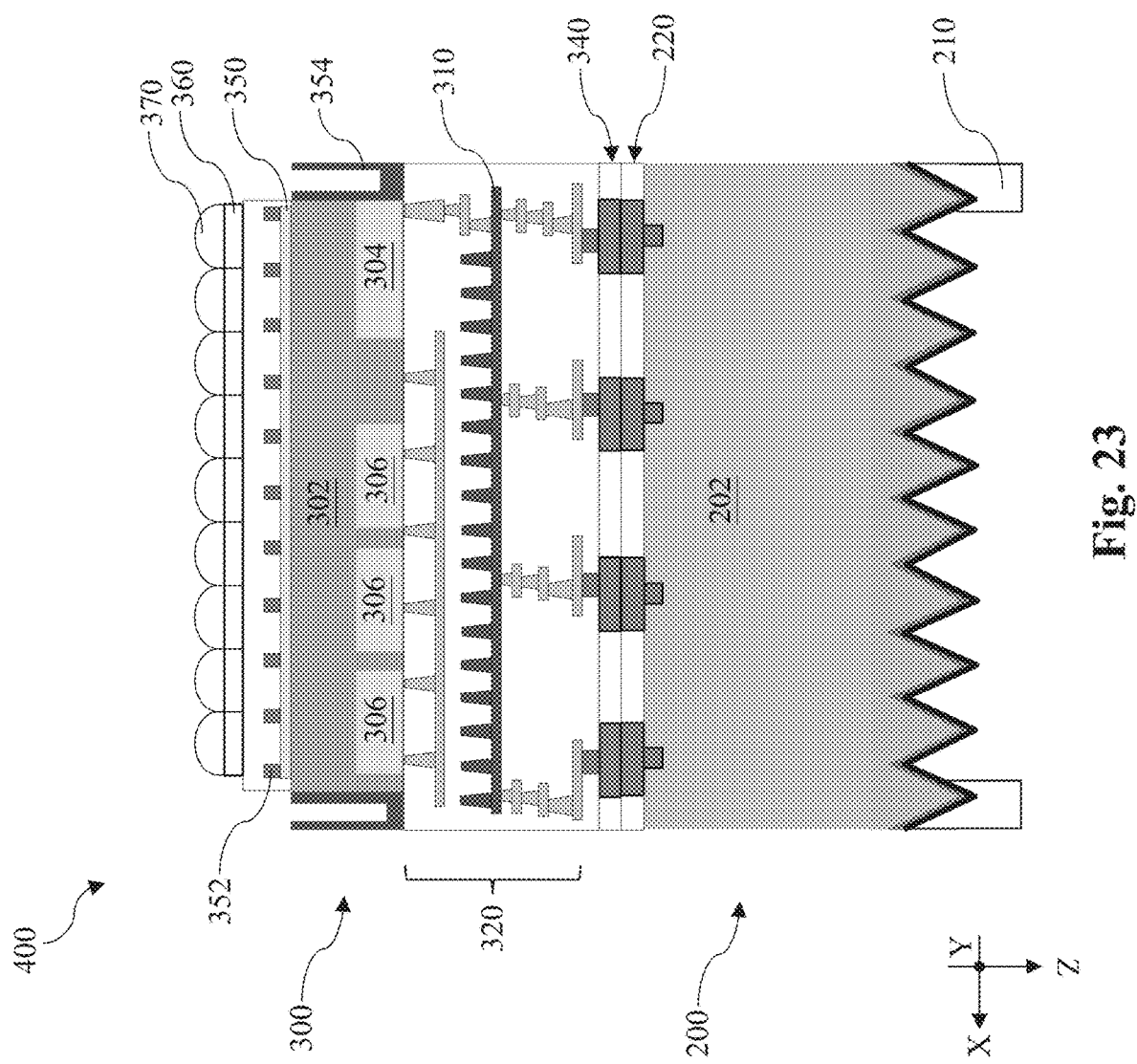

Referring to FIGS. 17 and 23, block 13 of method 100 includes an operation 1310 where a color filter array 360 and microlens features 370 are formed. The color filter array 360 may be formed of a polymeric material or a resin that includes color pigments. In operation 1310, the color filter array 360 is formed over the third workpiece 400. The color filter array 360 includes a plurality of filters each allowing for the transmission of electromagnetic radiation (e.g., light) having a specific range of wavelength, while blocking light of wavelengths outside of the specified range. Referring still to FIG. 23, microlens features 370 are then formed over the color filter array 360. The microlens features 370 may be formed of any material that may be patterned and formed into lenses, such as a high transmittance acrylic polymer. In an embodiment, a microlens layer may be formed using a material in a liquid state and spin-on techniques. This method has been found to produce a substantially planar surface and a microlens layer having a substantially uniform thickness, thereby providing greater uniformity in the microlens features 370. Other methods, such as CVD, PVD, or the like, may also be used. The planar material for the microlens layer may be patterned using a photolithography and etch technique to pattern the planar material in an array of microlens features 370 corresponding to the image sensors 306. The planar material may then be reflowed to form an appropriate curved surface for the microlens features 370. The microlens features 370 may be cured using an ultraviolet (UV) treatment.

Figure 24:
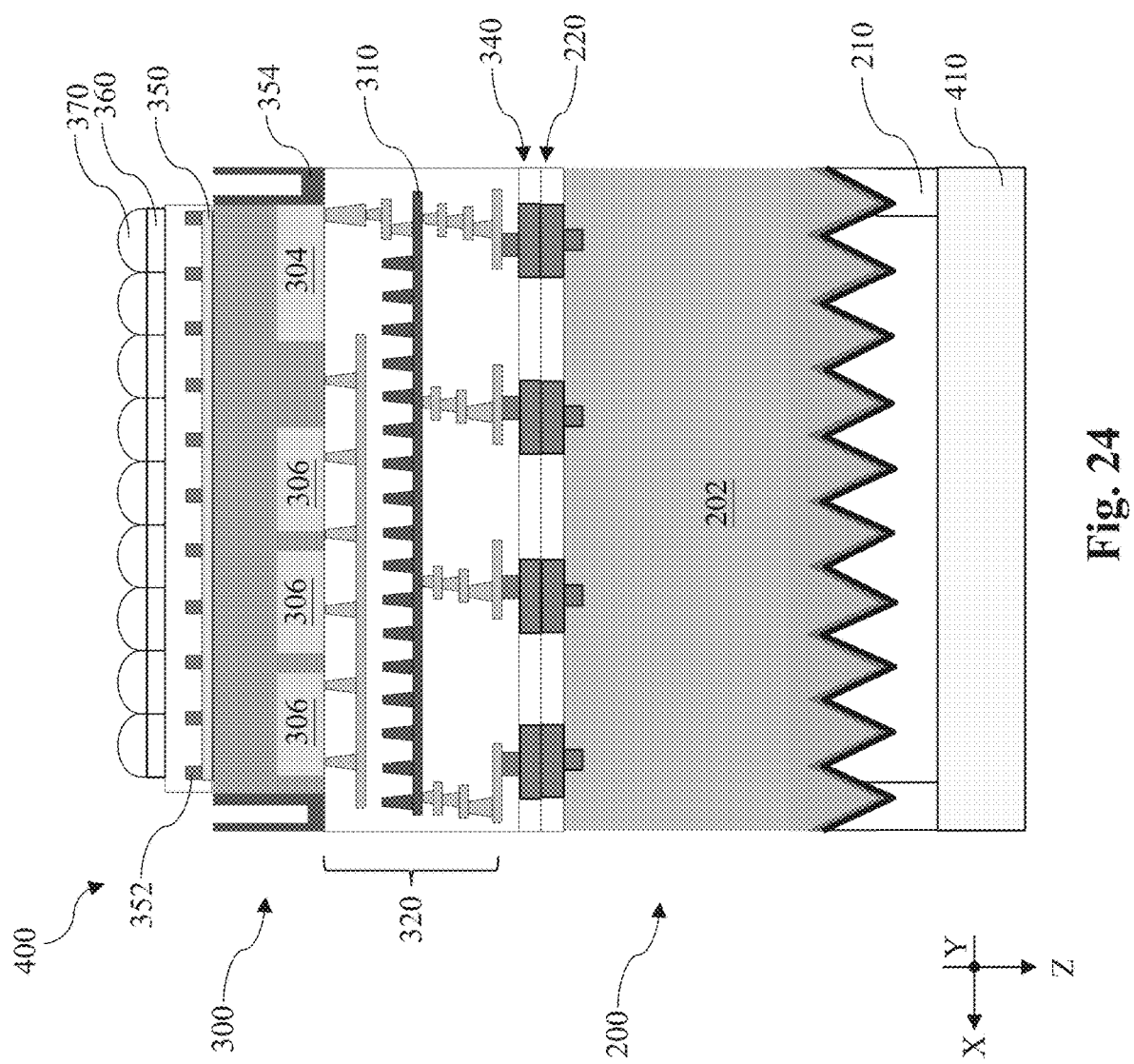
Figure 25:
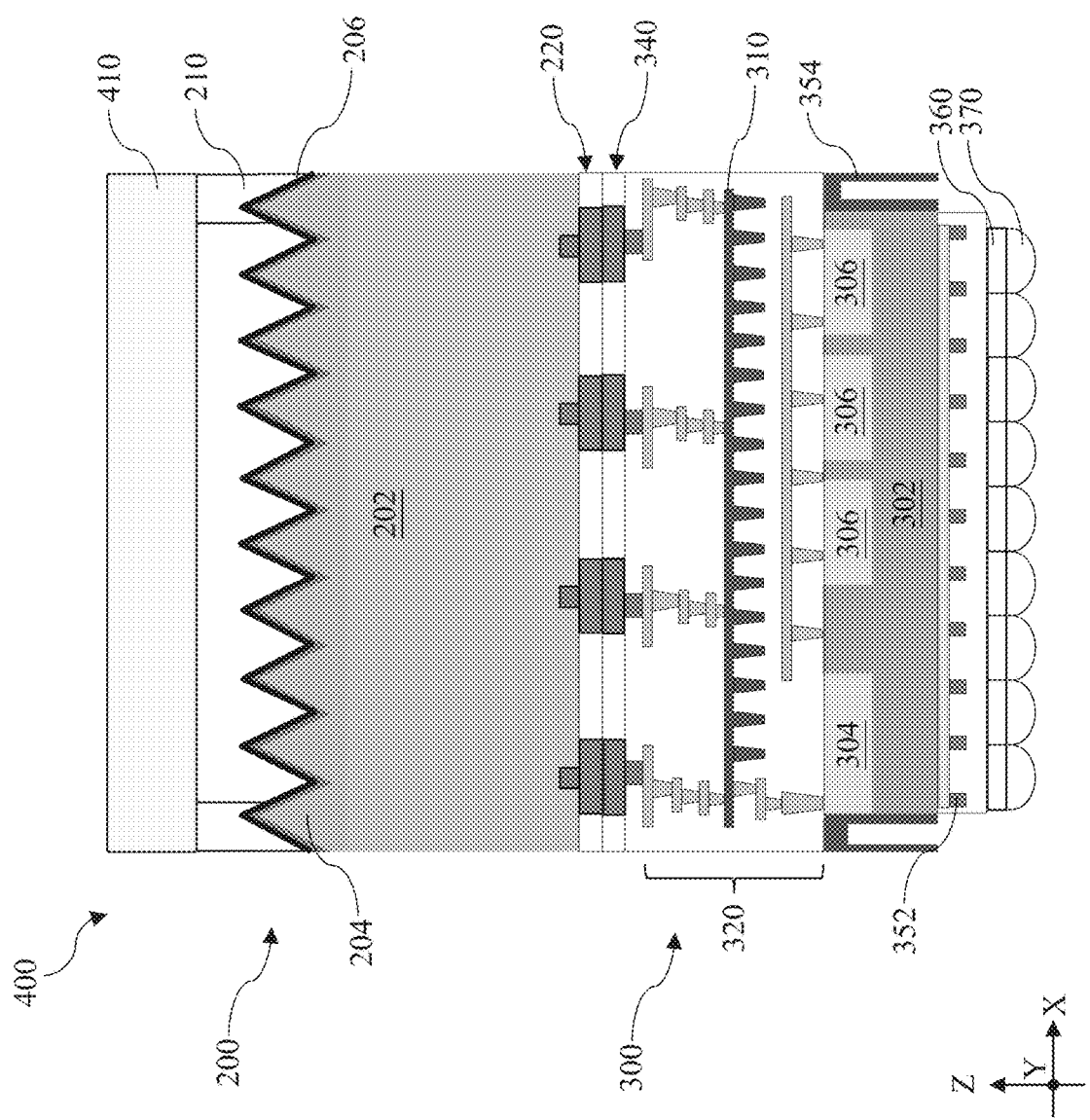

Referring to FIGS. 17, 24 and 25, block 13 of method 100 includes an operation 1312 where further processes are performed. Such further processes may include bonding the third workpiece 400 to a package substrate 410, as illustrated FIG. 24. To allow light transmission, the package substrate 410 is formed of a transparent material, such as glass. After the bonding of the package substrate 410, the third workpiece 400 is flipped over, as shown in FIG. 25.

Upon conclusion of operations of method 100, the third workpiece 400 includes a self-powered image sensor 400. The self-powered image sensor 400 includes a solar cell 200 and an image sensor 300 where the former acts as a part of the power supply system for the latter. Referring to FIG. 25, the solar cell 200 is electrically coupled to the MIM structure 310 by way of contact vias and metal lines in the interconnect structure 320. When shone upon by incident light, the solar cell 200 generates DC voltage that may be stored as charges in the MIM structure 310. The MIM structure 310 also helps minimize the voltage variation from the solar cell 200. The inverter 304 in the second substrate 302 is also electrically coupled to the MIM structure 310. The inverter 304 is configured to stabilize and convert the DC charges into AC signals that are provided to the image sensor array 300.

Depending on the energy conversion efficiency of the solar cell 200, the solar cell 200 may be similar to the image sensor array 300 in area/footprint or even larger than the image sensor array 300. When the solar cell 200 has a sufficient conversion efficiency to supply power to the image sensor array 300, the solar cell 200 and the image sensor array 300 may have the same size or footprint. When the solar cell 200 does not have sufficient conversion efficiency, the solar cell 200 may have a larger area to ensure the image sensor array 300 is appropriately powered. When the image sensor array 300 and the solar cell 200 have substantially the same area or footprint, their boundaries may substantially align vertically.

Figure 26:
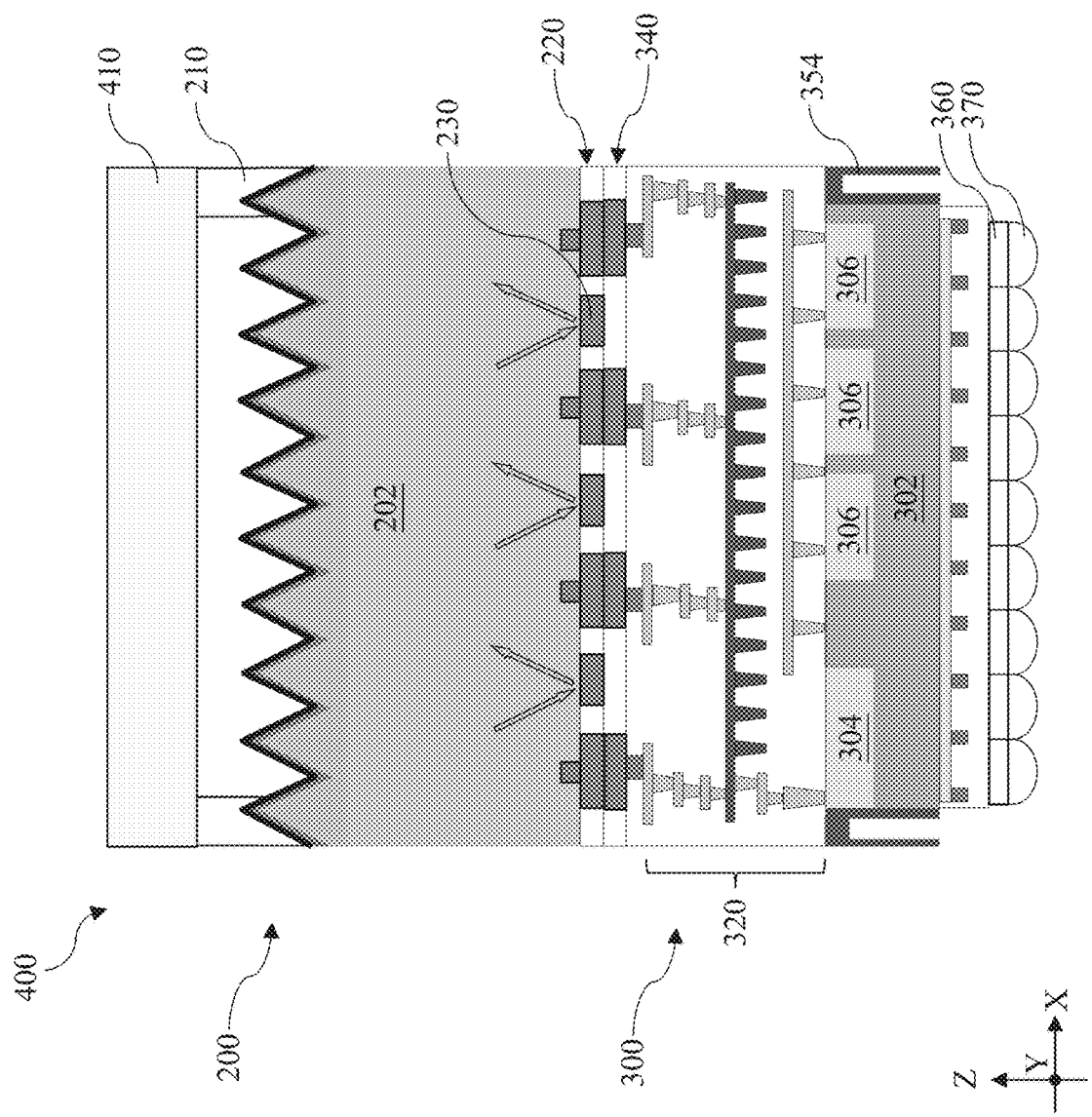
FIGS. 26-32 illustrate various alternative embodiments of self-powered image sensors, according to various aspects of the present disclosure.

FIGS. 26-32 illustrate various alternative embodiments of the self-powered image sensor 400 to improve the efficiency of the solar cell 200. In the alternative embodiment shown in FIG. 26, the first bonding layer 220 includes first metal reflectors 230 that are not aligned with or bonded to any metal features in the second bonding layer 340. In some embodiments, the first metal reflectors 230 include copper (Cu). As shown in FIG. 26, the first metal reflectors 230 are configured to reflect light that transmits through the first substrate 202 back to the solar cell 200 for further energy conversion.

Figure 27:
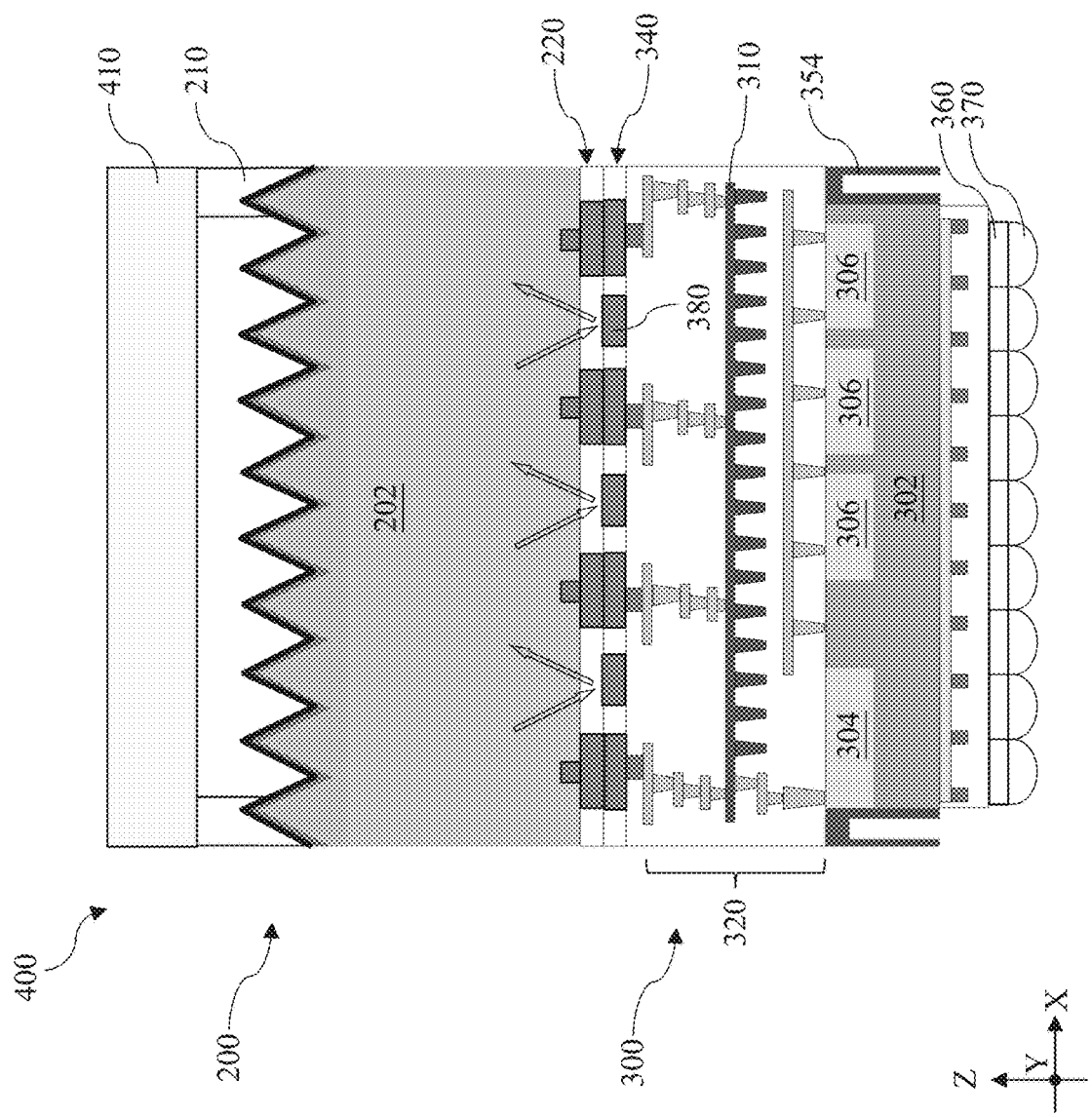

In the alternative embodiment shown in FIG. 27, the second bonding layer 340 includes second metal reflectors 380 that are not aligned with or bonded to any metal features in the first bonding layer 220. In some embodiments, the second metal reflectors 380 include copper (Cu). As shown in FIG. 27, the second metal reflectors 380 are configured to reflect light that transmits through the first substrate 202 back to the solar cell 200 for further energy conversion.

Figure 28:
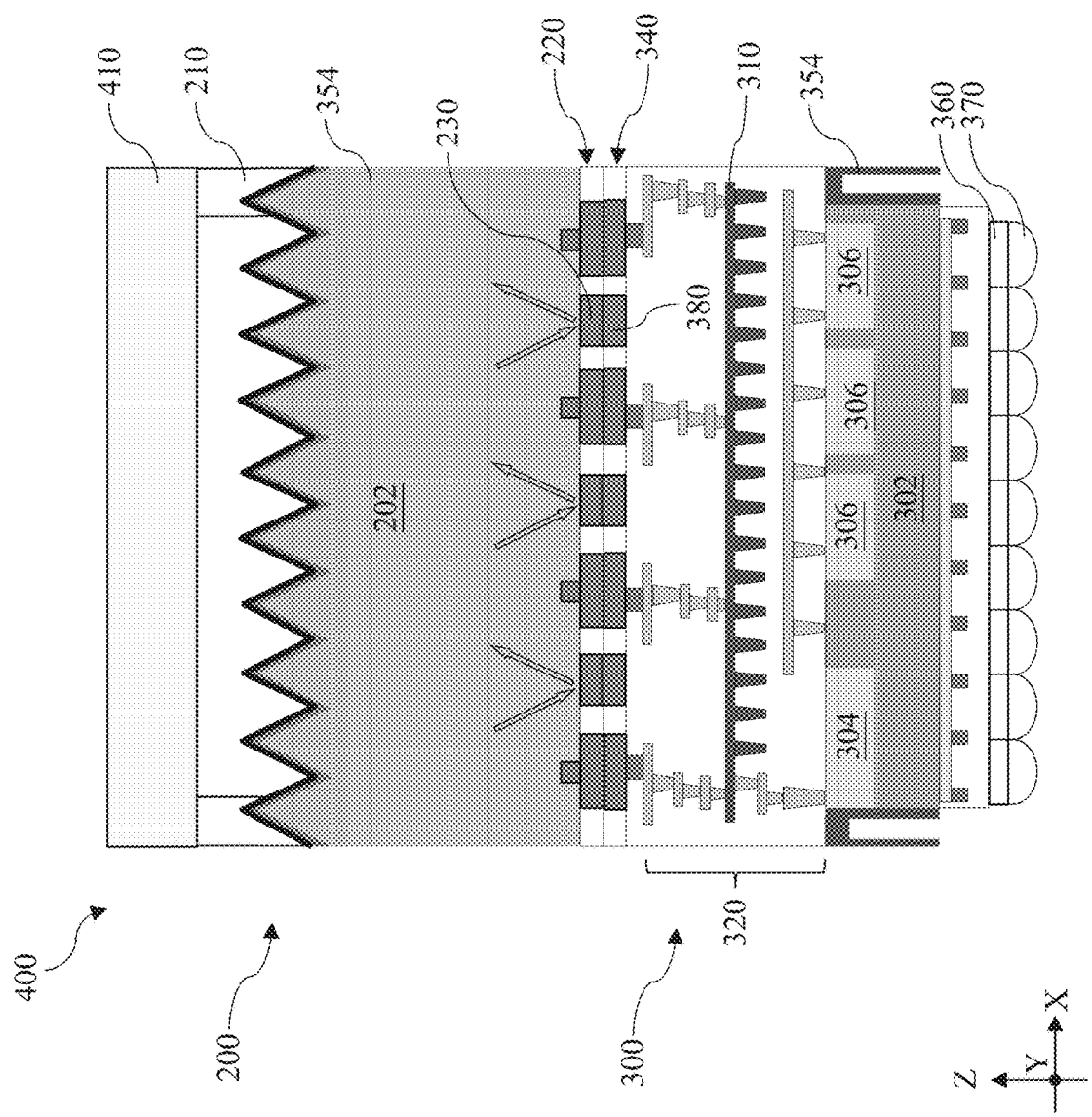

In the alternative embodiment shown in FIG. 28, the first bonding layer 220 includes first metal reflectors 230 and the second bonding layer 340 includes second metal reflectors 380. Each of the first metal reflectors 230 is aligned with and bonded to one of the second metal reflectors 380. In some embodiments, the first metal reflectors 230 and the second metal reflectors 380 include copper (Cu). As shown in FIG. 28, the first metal reflectors 230 are configured to reflect light that transmits through the first substrate 202 back to the solar cell 200 for further energy conversion.

Figure 29:
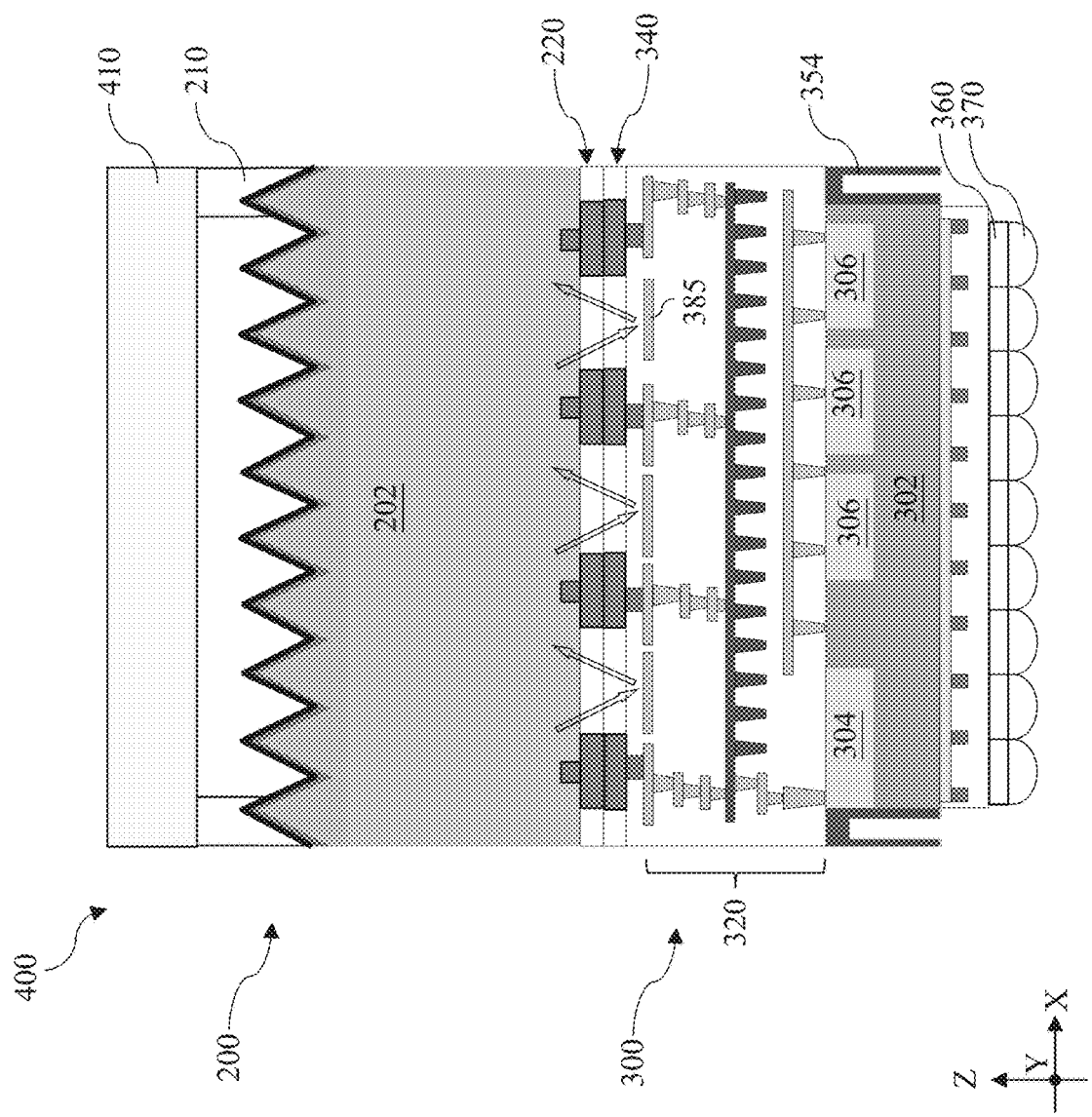

In the alternative embodiment shown in FIG. 29, the interconnect structure 320 includes top reflector features 385 that are not electrically coupled to any other metal features in the interconnect structure 320. That is, the top reflector features 385 are electrically floating and do not serve any electrical connection functions. In some embodiments, the top reflector features 385 include copper (Cu). As shown in FIG. 29, the top reflector features 385 are configured to reflect light that transmits through the first substrate 202 and the bonding layers back to the solar cell 200 for further energy conversion. In some instances, each of the top reflector features 385 is plate like and may have a rectangular to square shape when viewed along the Z direction. In these instances, the top reflector features 385 have different shapes than contact vias or metal lines.

Figure 30:
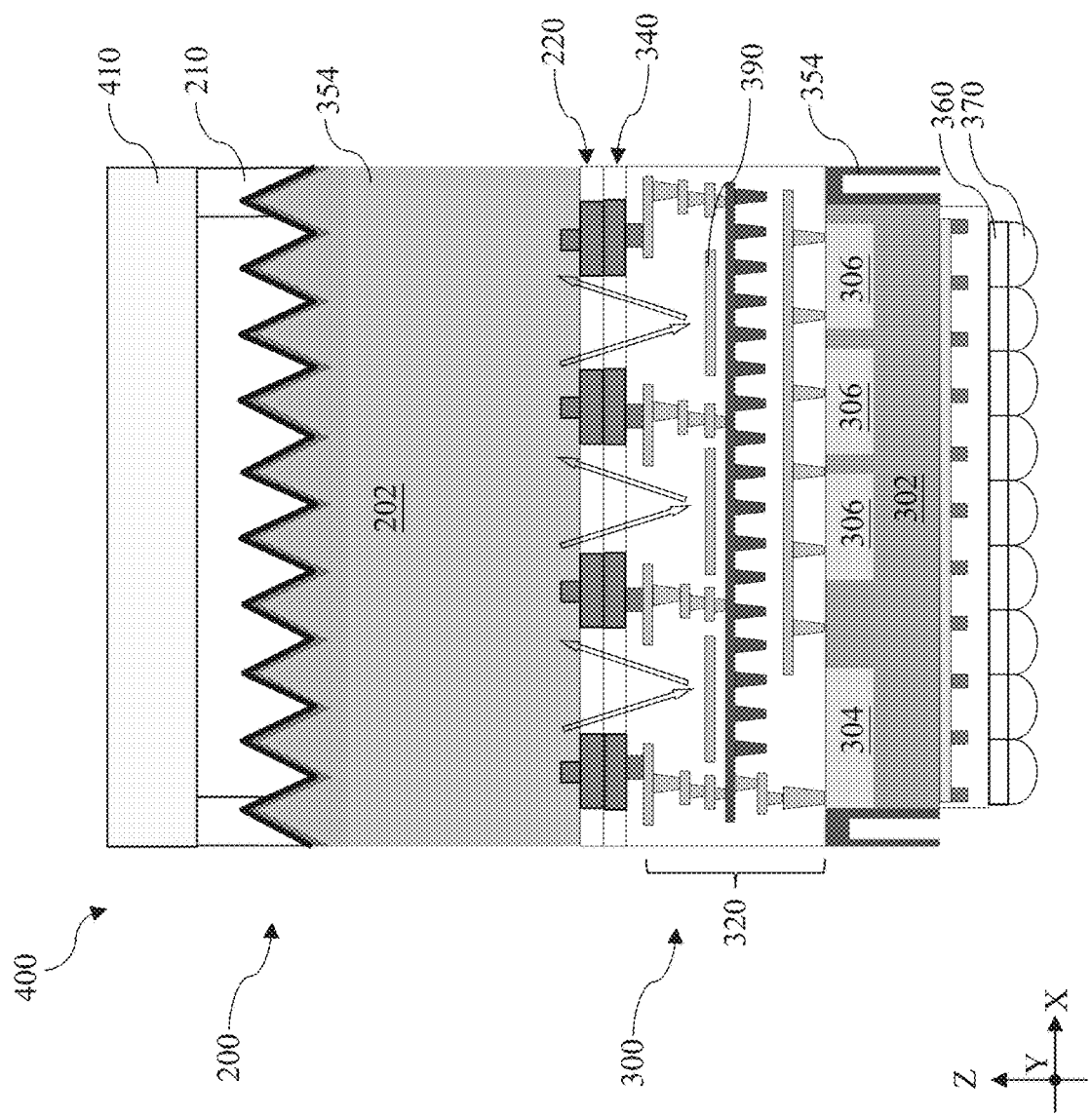

In the alternative embodiment shown in FIG. 30, the interconnect structure 320 includes mezzanine reflector features 390 that are not electrically coupled to any other metal features in the interconnect structure 320. That is, the mezzanine reflector features 390 are electrically floating and do not serve any electrical connection functions. As shown in FIG. 30, the mezzanine reflector features 390 are disposed in a metal layer immediately above the MIM structure 310. In some embodiments, the mezzanine reflector features 390 include copper (Cu). As shown in FIG. 30, the mezzanine reflector features 390 are configured to reflect light that transmits through the first substrate 202 and the bonding layers back to the solar cell 200 for further energy conversion. In some instances, each of the mezzanine reflector features 390 is plate like and may have a rectangular to square shape when viewed along the Z direction. In these instances, the mezzanine reflector features 390 have different shapes than contact vias or metal lines.

Figure 31:
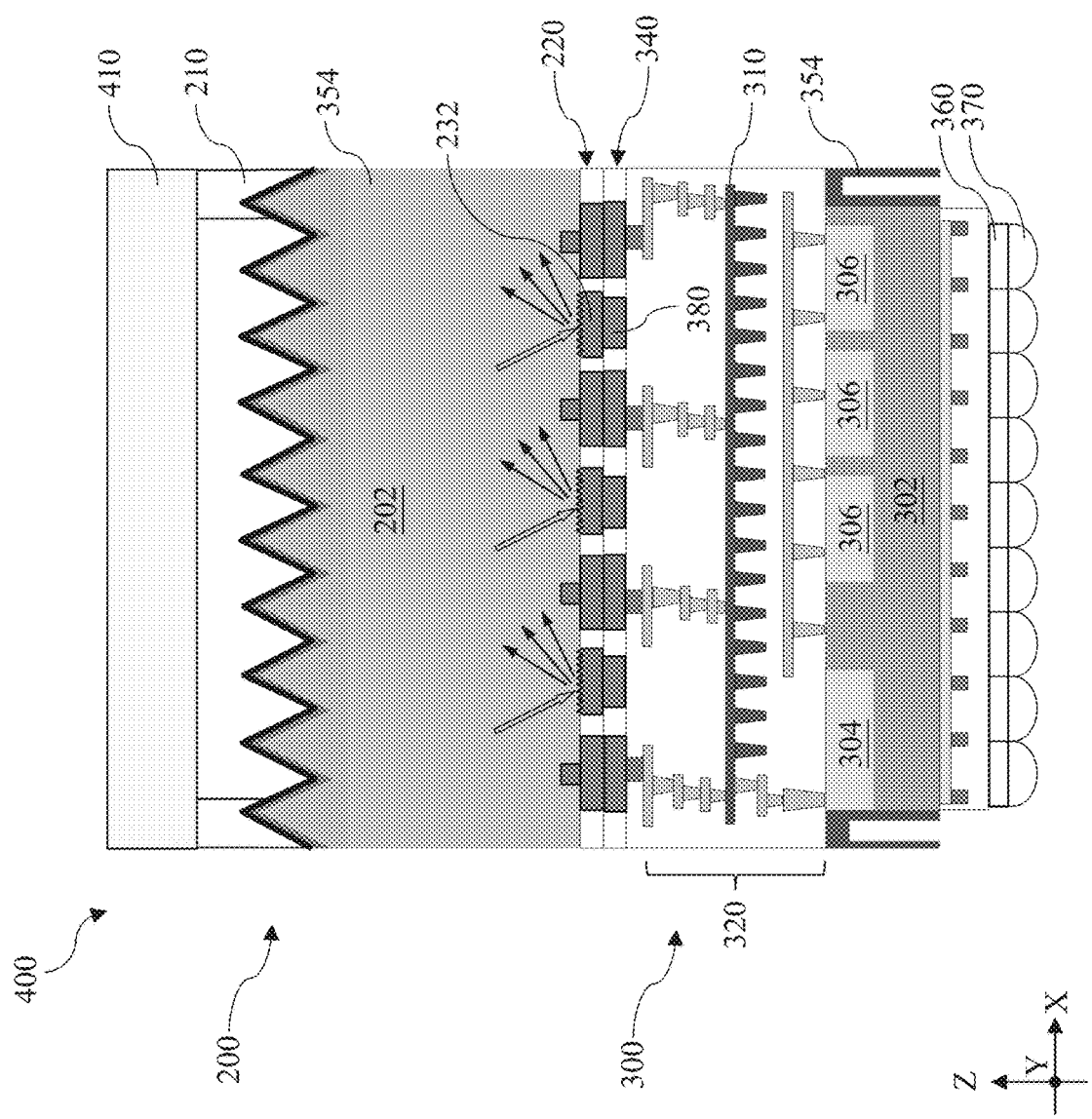

In the alternative embodiment shown in FIG. 31, the first bonding layer 220 includes first redirecting features 232 and the second bonding layer 340 includes second metal reflectors 380. Each of the first redirecting features 232 is aligned with and bonded to one of the second metal reflectors 380. In some embodiments, the first redirecting features 232 and the second metal reflectors 380 include copper (Cu). Different from the first metal reflectors 230, the first redirecting features 232 include textured surfaces facing the first substrate 202. As shown in FIG. 31, the first redirecting features 232 are configured to redirect light that transmits through the first substrate 202 into different portions of the solar cell 200 for further energy conversion. To form the first redirecting features 232, openings are formed in the first dielectric layer 214 to expose the first substrate 202. The exposed portions of the first substrate 202 are then etched to form the textured surface 204. It is noted that due to different etching rates along different lattice surfaces of the first substrate 202 (e.g., silicon), the etched surface naturally forms scallop-like surface texture 204. After a metal fill layer is formed in the opening, the first redirecting features 232 are formed.

Figure 32:
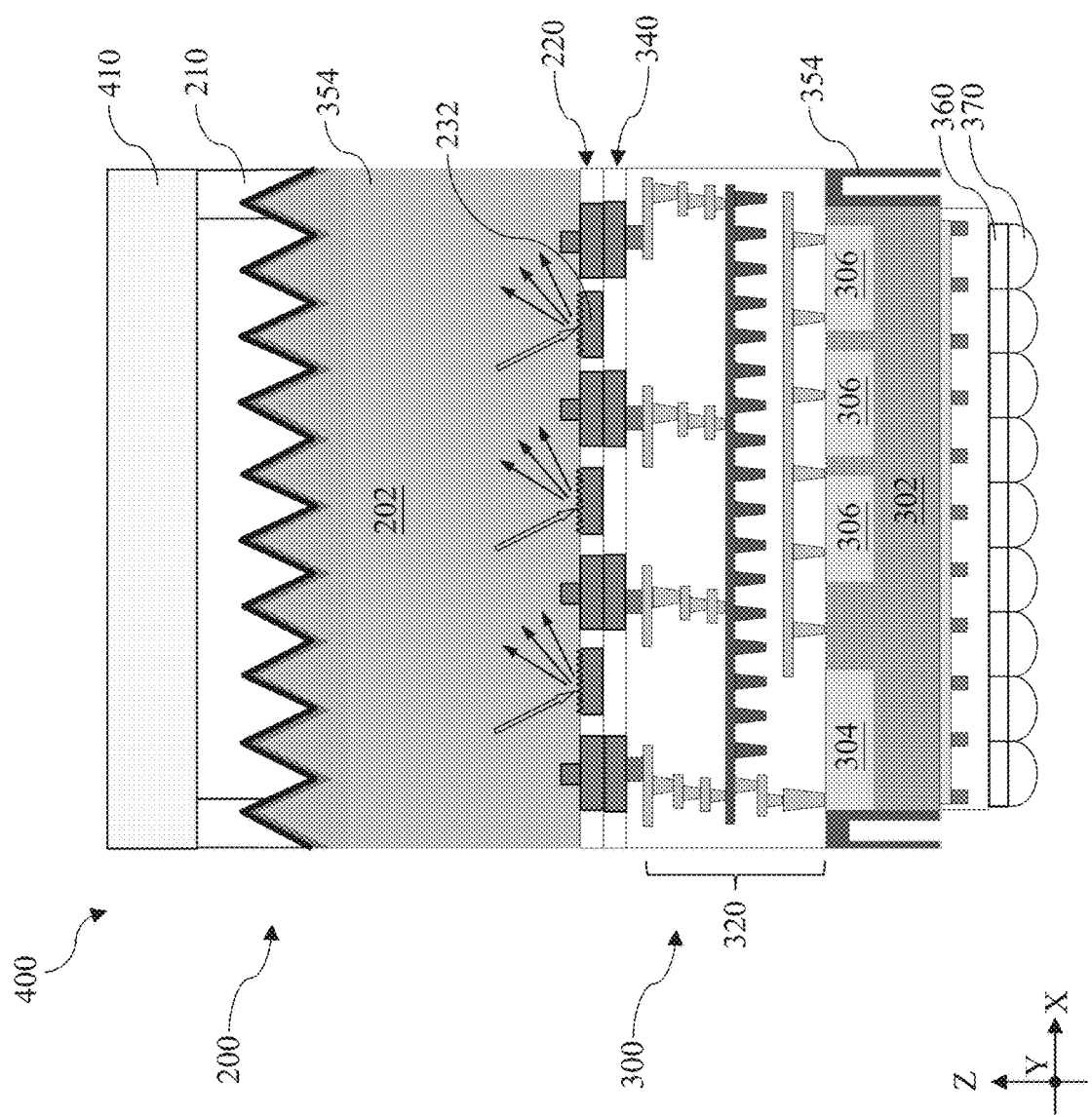

In the alternative embodiment shown in FIG. 32, the first bonding layer 220 includes first redirecting features 232 that are not aligned with or bonded to any metal features in the second bonding layer 340. The first redirecting features 232 may include copper (Cu). Different from the first metal reflectors 230, the first redirecting features 232 include textured surfaces facing the first substrate 202. As shown in FIG. 32, the first redirecting features 232 are configured to redirect light that transmits through the first substrate 202 into different portions of the solar cell 200 for further energy conversion. To form the first redirecting features 232, openings are formed in the first dielectric layer 214 to expose the first substrate 202. The exposed portions of the first substrate 202 are then etched to form the textured surface 204. After a metal fill layer is formed in the opening, the first redirecting features 232 are formed.

Thus, in some embodiments, the present disclosure provides an integrated circuit (IC) structure. The IC structure includes a first substrate including a plurality of photodiodes, an interconnect structure disposed on the first substrate, a first bonding layer disposed on the interconnect structure, a second bonding layer disposed on the first bonding layer, a second substrate disposed on the second bonding layer, and a transparent conductive oxide layer disposed on the second substrate.

In some embodiments, the second substrate includes a textured top region in direct contact with the transparent conductive oxide layer. In some implementations, the textured top region includes silicon and an n-type dopant. In some instances, the first bonding layer includes a first plurality of conductive pads embedded in a first dielectric layer, the second bonding layer includes a second plurality of conductive pads embedded in a second dielectric layer, and the first plurality of conductive pads are vertically aligned with the second plurality of conductive pads. In some embodiments, the interconnect structure includes a capacitor structure that includes a bottom metal layer, an insulator layer disposed on the bottom metal layer, and a top metal layer disposed on the insulator layer. In some embodiments, the first substrate further includes an inverter, the top metal layer is in electrical communication with at least one of the second plurality of conductive pads, and the bottom metal layer is in electrical communication with the inverter. In some embodiments, the IC structure further includes an antireflection coating on the transparent conductive oxide layer, and a metal grid disposed over the antireflection coating. In some embodiments, the first substrate has a first thickness and the second substrate has a second thickness greater than the first thickness. In some embodiments, the first thickness is between about 1 µm and about 8 µm and the second thickness is between about 150 µm and about 500 µm.

Another aspect of the present disclosure involves a structure. The structure includes a plurality of microlens features, a color filter array disposed on the plurality of microlens features, a first metal grid over the color filter array, a first substrate over the first metal grid, an interconnect structure over the first substrate, and a second substrate over the interconnect structure. The second substrate includes a top texture region and the interconnect structure includes a capacitor structure.

In some embodiments, the structure further includes a first bonding layer disposed on the interconnect structure and a second bonding layer disposed on the first bonding layer. In some implementations, the first bonding layer includes a first plurality of conductive pads embedded in a first dielectric layer, the second bonding layer includes a second plurality of conductive pads embedded in a second dielectric layer, and the first plurality of conductive pads are vertically aligned with the second plurality of conductive pads. In some implementations, the second bonding layer includes a plurality of reflective features configured to reflect electromagnetic radiation into the second substrate. In some implementations, the first substrate includes a plurality of photodiodes and an inverter and the plurality of photodiodes are separated from one another by deep trench isolation (DTI) features. In some instances, the interconnect structure includes a capacitor structure that includes a bottom metal layer, an insulator layer over the bottom metal layer, and a top metal layer over the insulator layer.

Yet another aspect of the present disclosure involves a method. The method includes forming a solar cell in a first substrate, forming a first bonding layer over a back side of the first substrate, forming an image sensor array in a second substrate, forming an interconnect structure over a front side of the second substrate, forming a second bonding layer over the interconnect structure, bonding the solar cell to the image sensor array by bonding the first bonding layer to the second bonding layer, after the bonding, forming a color filter array over a back side of the second substrate, and forming microlens features over the color filter array.

In some embodiments, the method further includes forming an inverter over the second substrate. In some implementation, the method further includes after the bonding and before the forming of the color filter array, thinning the second substrate from the back side of the second substrate. In some embodiments, the forming of the interconnect structure includes forming a metal-insulator-metal capacitor that includes a bottom metal layer, an insulator layer over the bottom metal layer, and a top metal layer over the insulator layer. In some implementations, the interconnect structure includes a plurality of metallization layers, the forming of the interconnect structure includes forming a plurality of metal reflector features in one of the plurality of metallization layers, and the plurality of metal reflector features are configured to reflect electromagnetic radiation into the solar cell.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:
1. An integrated circuit (IC) structure, comprising:
 a first substrate comprising a plurality of photodiodes;
 an interconnect structure disposed on the first substrate;
 a first bonding layer disposed on the interconnect structure;
 a second bonding layer disposed on the first bonding layer;
 a second substrate disposed on the second bonding layer; and
 a transparent conductive oxide layer disposed on the second substrate.

2. The IC structure of claim 1, wherein the second substrate comprises a textured top region in direct contact with the transparent conductive oxide layer.

3. The IC structure of claim 2, wherein the textured top region comprises silicon and an n-type dopant.

4. The IC structure of claim 1,
 wherein the first bonding layer comprises a first plurality of conductive pads embedded in a first dielectric layer,
 wherein the second bonding layer comprises a second plurality of conductive pads embedded in a second dielectric layer,
 wherein the first plurality of conductive pads are vertically aligned with the second plurality of conductive pads.

5. The IC structure of claim 4, wherein the interconnect structure comprises a capacitor structure that includes a bottom metal layer, an insulator layer disposed on the bottom metal layer, and a top metal layer disposed on the insulator layer.

6. The IC structure of claim 5,
 wherein the first substrate further comprises an inverter,
 wherein the top metal layer is in electrical communication with at least one of the second plurality of conductive pads,
 wherein the bottom metal layer is in electrical communication with the inverter.

7. The IC structure of claim 1, further comprising:
 an antireflection coating on the transparent conductive oxide layer; and
 a metal grid disposed over the antireflection coating.

8. The IC structure of claim 1,
 wherein the first substrate has a first thickness,
 wherein the second substrate has a second thickness greater than the first thickness.

9. The IC structure of claim 8,
wherein the first thickness is between about 1 μm and about 8 μm,
wherein the second thickness is between about 150 μm and about 500 μm.

10. A structure, comprising:
a plurality of microlens features;
a color filter array disposed on the plurality of microlens features;
a first metal grid over the color filter array;
a first substrate over the first metal grid;
an interconnect structure over the first substrate; and
a second substrate over the interconnect structure,
wherein the second substrate comprises a top texture region,
wherein the interconnect structure comprises a capacitor structure.

11. The structure of claim 10, further comprising:
a first bonding layer disposed on the interconnect structure; and
a second bonding layer disposed on the first bonding layer.

12. The structure of claim 11,
wherein the first bonding layer comprises a first plurality of conductive pads embedded in a first dielectric layer,
wherein the second bonding layer comprises a second plurality of conductive pads embedded in a second dielectric layer,
wherein the first plurality of conductive pads are vertically aligned with the second plurality of conductive pads.

13. The structure of claim 12, wherein the second bonding layer comprises a plurality of reflective features configured to reflect electromagnetic radiation into the second substrate.

14. The structure of claim 10,
wherein the first substrate comprises a plurality of photodiodes and an inverter,
wherein the plurality of photodiodes are separated from one another by deep trench isolation (DTI) features.

15. The structure of claim 10, wherein the interconnect structure comprises a capacitor structure that includes a bottom metal layer, an insulator layer over the bottom metal layer, and a top metal layer over the insulator layer.

16. A device structure, comprising:
an image sensor array;
an interconnect structure over the image sensor array;
a bonding layer over the interconnect structure;
a plurality of redirecting features disposed in the bonding layer; and
a substrate disposed over the bonding layer,
wherein each of the plurality of redirecting features comprises a textured surface facing the substrate,
wherein the substrate comprises a scallop-like surface texture on a surface facing away from the bonding layer.

17. The device structure of claim 16, wherein the plurality of redirecting features comprise copper (Cu).

18. The device structure of claim 16, wherein the substrate comprises silicon, germanium, or a III-V semiconductor material.

19. The device structure of claim 16, wherein the interconnect structure comprises a capacitor structure.

20. The device structure of claim 16, wherein the bonding layer comprises silicon oxide or silicon oxynitride.

* * * * *